(12) United States Patent
Nakadate et al.

(10) Patent No.: US 11,756,971 B2
(45) Date of Patent: Sep. 12, 2023

(54) SOLID-STATE IMAGING ELEMENT AND IMAGING APPARATUS

(71) Applicant: Sony Semiconductor Solutions Corporation, Kanagawa (JP)

(72) Inventors: Kazuhiko Nakadate, Kanagawa (JP); Toshifumi Wakano, Kanagawa (JP); Masahiko Nakamizo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/087,054

(22) Filed: Dec. 22, 2022

(65) Prior Publication Data

US 2023/0136655 A1 May 4, 2023

Related U.S. Application Data

(63) Continuation of application No. 17/321,019, filed on May 14, 2021, now Pat. No. 11,552,114, which is a (Continued)

(30) Foreign Application Priority Data

Jun. 5, 2017 (JP) ................................ 2017-110522

(51) Int. Cl.
*H01L 27/146* (2006.01)
*H04N 25/77* (2023.01)

(52) U.S. Cl.
CPC .. *H01L 27/14605* (2013.01); *H01L 27/14612* (2013.01); *H01L 27/14643* (2013.01); *H04N 25/77* (2023.01)

(58) Field of Classification Search
CPC ......... H01L 27/14605; H01L 27/14612; H01L 27/14643; H04N 25/77
(Continued)

(56) References Cited

U.S. PATENT DOCUMENTS 11,031,421 B2    6/2021  Nakadate et al.
11,552,114 B2 *  1/2023  Nakadate .......... H01L 27/14612
(Continued)

FOREIGN PATENT DOCUMENTS

JP    2013-062789 A    4/2013

*Primary Examiner* — Igwe U Anya
(74) *Attorney, Agent, or Firm* — Michael Best & Friedrich LLP

(57) ABSTRACT

A solid-state imaging element of a pixel sharing type with improved driving of transistors is disclosed. A first electric charge accumulating section and a second electric charge accumulating section are arranged in a predetermined direction. A first transfer section transfers electric charge from first photoelectric conversion elements to the first electric charge accumulating section, causing it to accumulate the electric charge. A second transfer section transfers electric charge from second photoelectric conversion elements to the second electric charge accumulating section, causing it to accumulate the electric charge. A first transistor is configured to output a signal corresponding to an amount of the electric charge accumulated in each of the first electric charge accumulating section and the second electric charge accumulating section. A second transistor is arranged with the first transistor in the predetermined direction and connected in parallel to the first transistor.

9 Claims, 25 Drawing Sheets

Related U.S. Application Data continuation of application No. 16/610,292, filed as application No. PCT/JP2018/006609 on Feb. 23, 2018, now Pat. No. 11,031,421.

(58) Field of Classification Search
USPC .......................................................... 257/291
See application file for complete search history.

(56) References Cited

U.S. PATENT DOCUMENTS

| | | |
|---|---|---|
| 2013/0049082 A1 | 2/2013 | Kato et al. |
| 2013/0140610 A1 | 6/2013 | Kudoh |
| 2016/0065857 A1 | 3/2016 | Yasuda et al. |
| 2017/0013211 A1 | 1/2017 | Kato |
| 2017/0110503 A1 | 4/2017 | Kato et al. |
| 2017/0201705 A1 | 7/2017 | Ishiwata |

* cited by examiner

F I G . 2
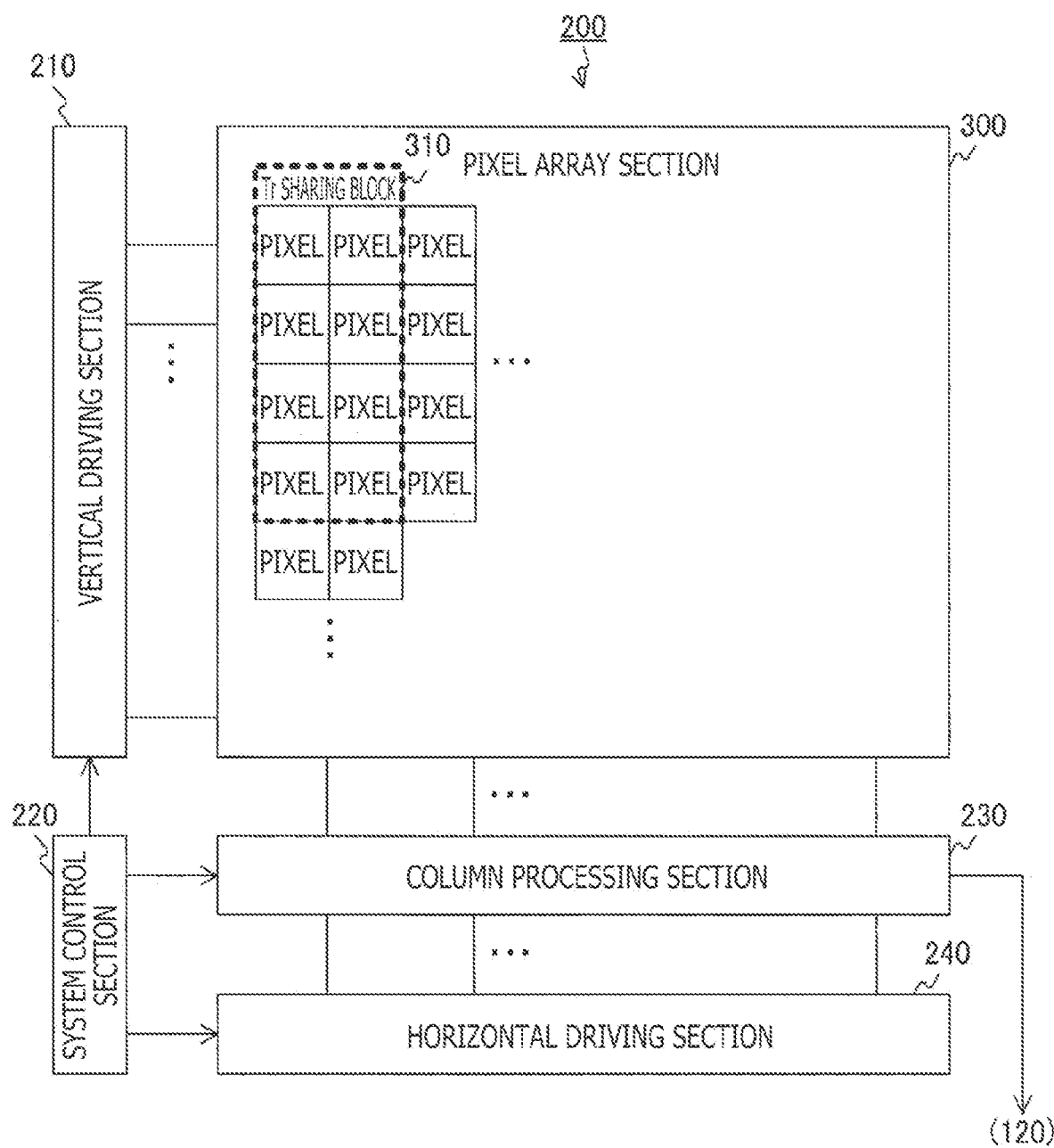

SOLID-STATE IMAGING ELEMENT AND IMAGING APPARATUS

CROSS REFERENCES TO RELATED APPLICATIONS

The present Application is a Continuation Application of U.S. patent application Ser. No. 17/321,019 filed May 14, 2021, which is a Continuation Application of U.S. patent application Ser. No. 16/610,292 filed Nov. 1, 2019, now U.S. Pat. No. 11,031,421 issued on Jun. 8, 2021, which is a 371 National Stage Entry of International Application No.: PCT/JP2018/006609, filed on Feb. 23, 2018, which in turn claims priority from Japanese Application No. 2017-110522, filed on Jun. 5, 2017, the entire contents of which are incorporated herein by reference.

TECHNICAL FIELD

The present technology relates to a solid-state imaging element and an imaging apparatus. Specifically, the present technology relates to a solid-state imaging element and an imaging apparatus in which a plurality of photoelectric conversion elements shares transistors.

BACKGROUND ART

In the past, a solid-state imaging element has had a pixel sharing type structure for the purpose of reducing the number of transistors per pixel. In the pixel sharing type structure, a plurality of pixels shares a FD (Floating Diffusion) and transistors. For example, a solid-state imaging element of an eight-pixel sharing type has been proposed (see PTL 1, for example). In the solid-state imaging element of the eight-pixel sharing type, eight pixels share a transistor group including a selection transistor, an amplification transistor, and a reset transistor.

CITATION LIST

Patent Literature

[PTL 1]
Japanese Patent Laid-Open No. 2013-62789

SUMMARY

Technical Problems

In the above-described past technology, since the transistor group is shared by the eight pixels, the number of transistors per pixel can be reduced and the light receiving areas of the photoelectric conversion elements can be increased accordingly, as compared with a case where the transistor group is not shared. However, in the above-described solid-state imaging element, each transistor is arranged between adjacent photodiodes. As a result, there is a possibility that an increase in the size of the gate width or the like of the transistor may require a reduction in the light receiving areas. Therefore, it is difficult to increase the gate width of the transistor without reducing the light receiving areas. Since the driving force of a transistor is proportional to the gate width, there is an issue that a narrow gate width results in insufficient driving force of the transistor. The insufficient driving force of the transistor is not preferable because the optical characteristics such as sensitivity deteriorate. As the miniaturization progresses, the area per pixel decreases and thus this issue becomes conspicuous.

The present technology has been made in view of the above-described situation. An object of the present technology is to improve the driving force of transistors in a solid-state imaging element of a pixel sharing type.

Solution to Problems

The present technology has been made to solve the above-described issue. The first aspect of the present technology is a solid-state imaging element including: a first electric charge accumulating section and a second electric charge accumulating section arranged in a predetermined direction; a plurality of first photoelectric conversion elements; a first transfer section configured to transfer electric charge from the plurality of first photoelectric conversion elements to the first electric charge accumulating section and cause the first electric charge accumulating section to accumulate the electric charge; a plurality of second photoelectric conversion elements; a second transfer section configured to transfer electric charge from the plurality of second photoelectric conversion elements to the second electric charge accumulating section and cause the second electric charge accumulating section to accumulate the electric charge; a first transistor configured to output a signal corresponding to an amount of the electric charge accumulated in each of the first electric charge accumulating section and the second electric charge accumulating section; and a second transistor arranged with the first transistor in the predetermined direction and connected in parallel to the first transistor. Accordingly, there is an effect that the driving force of the transistors connected in parallel is improved.

Further, in the first aspect, each of the first electric charge accumulating section and the second electric charge accumulating section may be configured to generate a voltage corresponding to the amount of the accumulated electric charge, and each of the first transistor and the second transistor may include an amplification transistor configured to amplify the voltage and output the voltage as the signal. Accordingly, there is an effect that the driving force of the amplification transistors is improved.

Further, in the first aspect, a selection transistor and a reset transistor arranged in the predetermined direction may be further included. The selection transistor may be configured to, according to a predetermined selection signal, open and close a path between: the first transistor and the second transistor; and a predetermined signal line, and the reset transistor may be configured to initialize the first electric charge accumulating section and the second electric charge accumulating section. Accordingly, there is an effect that blocks sharing the electric charge accumulating sections are symmetrical to each other.

Further, in the first aspect, a third transistor and a fourth transistor arranged in the predetermined direction may be further included. The third transistor may include a selection transistor configured to open and close a path between the first transistor and a predetermined signal line according to a predetermined selection signal, and the fourth transistor may include a selection transistor configured to open and close a path between the third transistor and the predetermined signal line according to the predetermined selection signal. Accordingly, there is an effect that the driving force of the selection transistors is improved.

Further, in the first aspect, a reset transistor and a dummy transistor arranged in the predetermined direction may be further included. The reset transistor may be configured to initialize the first electric charge accumulating section and the second electric charge accumulating section. Accordingly, there is an effect that the blocks sharing the electric charge accumulating sections are symmetrical to each other.

Further, in the first aspect, a reset transistor and a fifth transistor arranged in the predetermined direction may be further included. The reset transistor may be configured to initialize the first electric charge accumulating section and the second electric charge accumulating section. Accordingly, there is an effect that the blocks sharing the electric charge accumulating sections are symmetrical to each other.

Further, in the first aspect, the fifth transistor may include an amplification transistor connected in parallel to the first transistor and the second transistor. Accordingly, there is an effect that the driving force of the amplification transistors is improved.

Further, in the first aspect, the fifth transistor may include a selection transistor connected in parallel to one of the third transistor and the fourth transistor. Accordingly, there is an effect that the driving force of the selection transistors is improved.

Further, in the first aspect, an amplification transistor and a reset transistor arranged in the predetermined direction may be further included. Each of the first transistor and the second transistor may include a selection transistor configured to open and close a path between a third transistor and a predetermined signal line according to a predetermined selection signal, each of the first electric charge accumulating section and the second electric charge accumulating section may be configured to generate a voltage corresponding to the amount of the accumulated electric charge, the amplification transistor may be configured to amplify the voltage and output the voltage as the signal, and the reset transistor may be configured to initialize the first electric charge accumulating section and the second electric charge accumulating section. Accordingly, there is an effect that the driving force of the selection transistors is improved.

Further, in the first aspect, another transistor different from the first transistor and the second transistor may be further included. The another transistor and one of the first transistor and the second transistor may be arranged in a direction perpendicular to the predetermined direction. Accordingly, there is an effect that the size of a pixel array section in the direction perpendicular to the predetermined direction is reduced.

Further, in the first aspect, another transistor different from the first transistor and the second transistor may be further included. The first transistor, the second transistor, and the another transistor may be arranged in the predetermined direction. Accordingly, there is an effect that the size of the pixel array section in the predetermined direction is reduced.

Further, in the first aspect, a wiring layer in which a signal line connected to the first transistor and the second transistor is wired along the predetermined direction may be further included. Accordingly, there is an effect that the number of wires is reduced.

Further, a second aspect of the present technology is an imaging apparatus including: a first electric charge accumulating section and a second electric charge accumulating section arranged in a predetermined direction; a plurality of first photoelectric conversion elements; a first transfer section configured to transfer electric charge from the plurality of first photoelectric conversion elements to the first electric charge accumulating section and cause the first electric charge accumulating section to accumulate the electric charge; a plurality of second photoelectric conversion elements; a second transfer section configured to transfer electric charge from the plurality of second photoelectric conversion elements to the second electric charge accumulating section and cause the second electric charge accumulating section to accumulate the electric charge; a first transistor configured to output a signal corresponding to an amount of the electric charge accumulated in each of the first electric charge accumulating section and the second electric charge accumulating section; a second transistor arranged with the first transistor in the predetermined direction and connected in parallel to the first transistor; and a signal processing section configured to perform predetermined processing on the signal. Accordingly, there is an effect that image data whose image quality has been improved by the driving force of the transistors is processed.

Advantageous Effect of Invention

The present technology can provide an excellent effect that the driving force of transistors can be improved in a solid-state imaging element of a pixel sharing type. It is to be noted that the effects described herein are not necessarily limitative, and any of the effects described in the present disclosure may be provided.

BRIEF DESCRIPTION OF DRAWINGS

FIG. 2 is a block diagram depicting an example of a configuration of a solid-state imaging element according to the first embodiment of the present technology.

DESCRIPTION OF EMBODIMENTS

Hereinafter, modes for carrying out the present technology (hereinafter referred to as embodiments) will be described. The description will be made in the following order.

1. First Embodiment (an example in which two transistors connected in parallel are arranged in a vertical direction)

2. Second Embodiment (an example in which two of three amplification transistors connected in parallel are arranged in the vertical direction)

3. Third Embodiment (an example in which two of three selection transistors connected in parallel are arranged in the vertical direction)

4. Fourth Embodiment (an example in which the two amplification transistors connected in parallel are arranged in the vertical direction)

5. Fifth Embodiment (an example in which the two selection transistors connected in parallel are arranged in the vertical direction)

6. Sixth Embodiment (an example in which the two selection transistors connected in parallel and other transistors are arranged in the vertical direction)

7. Seventh Embodiment (an example in which the two amplification transistors connected in parallel and other transistors are arranged in the vertical direction)

8. Example of Application to Endoscopic Surgery System

9. Example of Application to Mobile Body

1. First Embodiment

[Example of Configuration of Imaging Apparatus]

Figure 1:
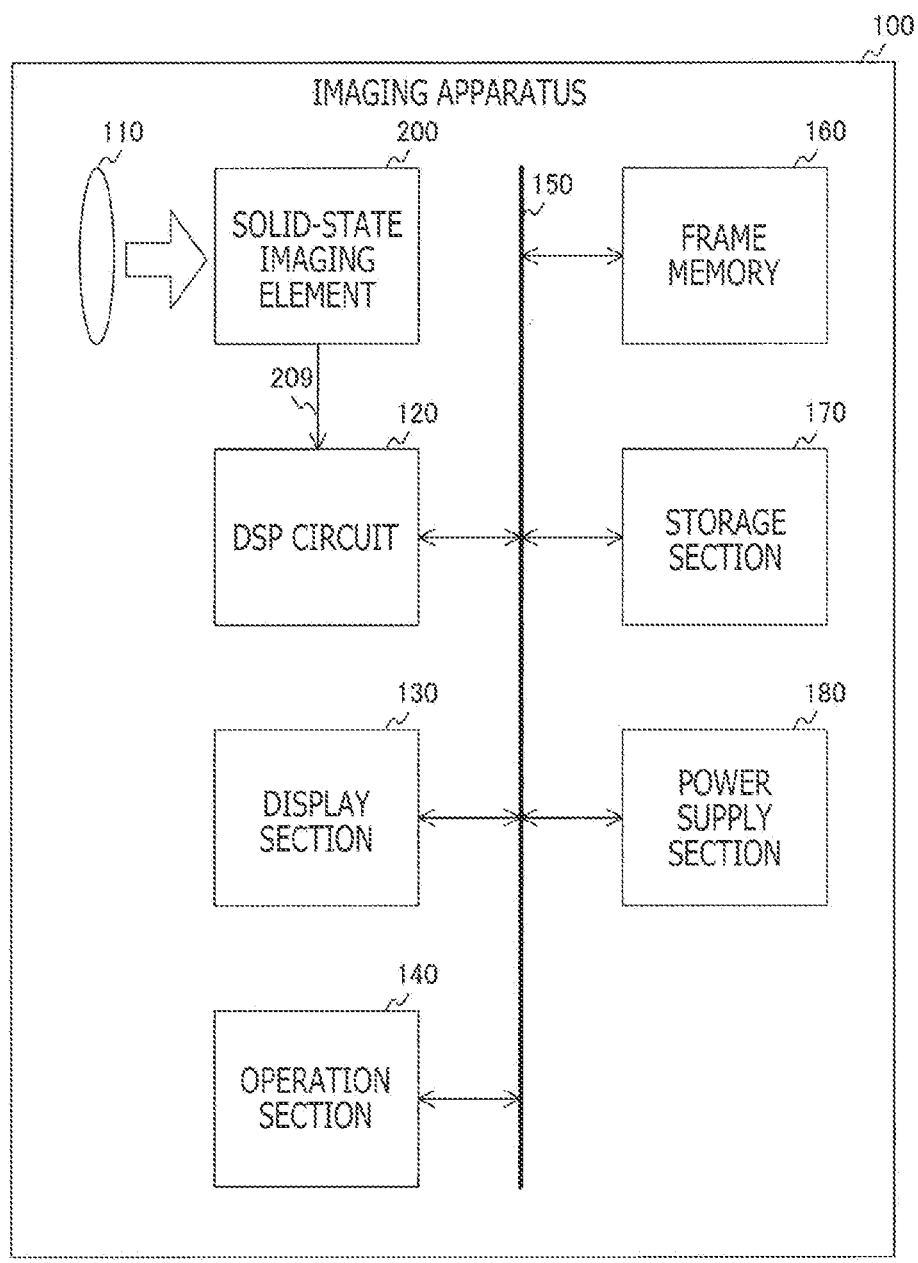
FIG. 1 is a block diagram depicting an example of a configuration of an imaging apparatus according to a first embodiment of the present technology.

FIG. 1 is a block diagram depicting an example of a configuration of an imaging apparatus 100 according to the first embodiment of the present technology. The imaging apparatus 100 is an apparatus for imaging image data, and includes an optical section 110, a solid-state imaging element 200, and a DSP (Digital Signal Processing) circuit 120. In addition, the imaging apparatus 100 includes a display section 130, an operation section 140, a bus 150, a frame memory 160, a storage section 170, and a power supply section 180. In addition to a digital camera such as a digital still camera, a smartphone or a personal computer having an imaging function is assumed as the imaging apparatus 100, for example.

The optical section 110 collects light from a subject and guides the light to the solid-state imaging element 200. The solid-state imaging element 200 generates image data by performing photoelectric conversion in synchronization with a vertical synchronization signal. Here, the vertical synchronization signal is a periodic signal having a predetermined frequency that indicates the timing of imaging. The solid-state imaging element 200 supplies the generated image data to the DSP circuit 120 through a signal line 209.

The DSP circuit 120 performs predetermined signal processing on the image data from the solid-state imaging element 200. The DSP circuit 120 outputs the processed image data to the frame memory 160 and the like through the bus 150. It is to be noted that at least a part of signal processing in the DSP circuit 120 may be performed in the solid-state imaging element 200, instead of the DSP circuit 120. Further, the DSP circuit 120 is an example of a signal processing section described in claims.

The display section 130 displays the image data. A liquid crystal panel or an organic EL (Electro Luminescence) panel is assumed as the display section 130, for example. The operation section 140 generates an operation signal according to a user operation.

The bus 150 is a common path used for the optical section 110, the solid-state imaging element 200, the DSP circuit 120, the display section 130, the operation section 140, the frame memory 160, the storage section 170, and the power supply section 180 to exchange data with each other.

The frame memory 160 holds the image data. The storage section 170 stores various types of data such as the image data. The power supply section 180 supplies power to the solid-state imaging element 200, the DSP circuit 120, the display section 130, and the like.

[Example of Configuration of Solid-State Imaging Element]

FIG. 2 is a block diagram depicting an example of a configuration of the solid-state imaging element 200 according to the first embodiment of the present technology. The solid-state imaging element 200 includes a vertical driving section 210, a pixel array section 300, a system control section 220, a column processing section 230, and a horizontal driving section 240.

In the pixel array section 300, a plurality of pixels is arranged in a two-dimensional grid. Hereinafter, a collection of pixels arranged in a predetermined direction (for example, a horizontal direction) will be referred to as "row," while a collection of pixels arranged in a direction perpendicular to the row will be referred to as "column." The pixel array section 300 is divided into a plurality of Tr sharing blocks 310. Each of the plurality of Tr sharing blocks 310 includes a predetermined number of pixels (for example, eight pixels in two columns×four rows). Each pixel in the corresponding Tr sharing block 310 shares a transistor group.

The vertical driving section 210 drives the pixels in the pixel array section 300 all at once or in units of rows. The vertical driving section 210 includes a shift register and an address decoder, for example. Further, pixel signals from the pixels driven by the vertical driving section 210 are input into the column processing section 230 for each column.

The column processing section 230 performs processing such as CDS (Correlated Double Sampling) processing and AD (Analog to Digital) conversion processing on the pixel signals for each column. The column processing section 230 outputs processed pixel data to the DSP circuit 120.

The horizontal driving section 240 selects a column in turns and causes the column processing section 230 to output the pixel data for the column. The horizontal driving section 240 includes a shift register, an address decoder, and the like, for example.

The system control section 220 controls a drive timing of each of the vertical driving section 210, the column processing section 230, and the horizontal driving section 240. The system control section 220 includes a timing generator, for example. The system control section 220 controls the vertical driving section 210 and the like on the basis of various types of timing signals generated by the timing generator.

It is to be noted that the vertical driving section 210, the pixel array section 300, the system control section 220, the column processing section 230, and the horizontal driving section 240 may be provided on the same semiconductor substrate or may be dispersedly arranged on a plurality of stacked semiconductor substrates.

[Example of Configuration of Pixel Array Section]

Figure 3:
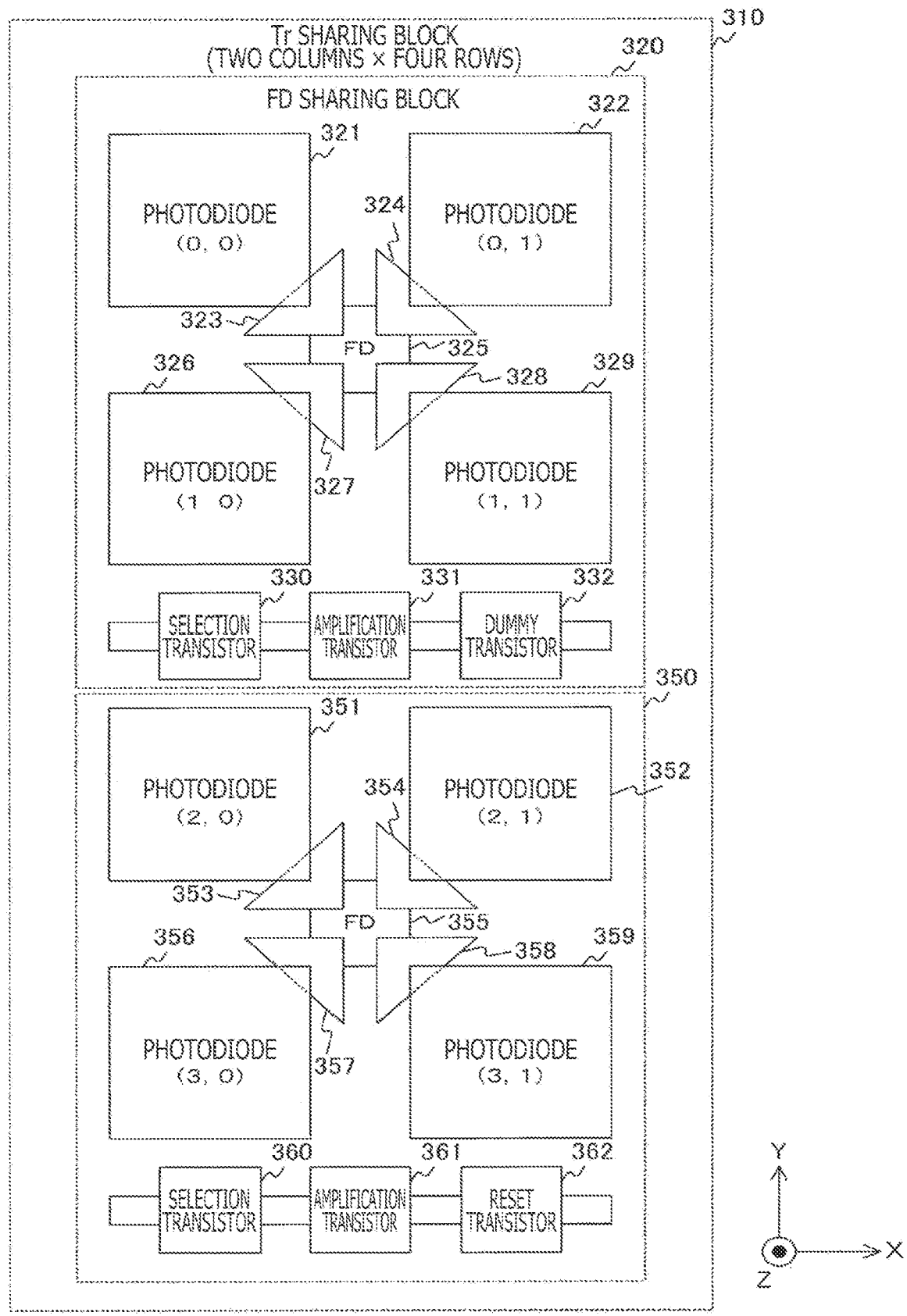
FIG. 3 is a plan view depicting an example of a layout of elements in a Tr sharing block according to the first embodiment of the present technology.

FIG. 3 is a plan view depicting an example of a layout of elements in the Tr sharing block 310 according to the first embodiment of the present technology. The Tr sharing block 310 includes an FD sharing block 320 and an FD sharing block 350. In the FD sharing block 320, photodiodes 321, 322, 326, and 329, an FD 325, and a transistor group are arranged. The transistor group in the FD sharing block 320 includes transfer transistors 323, 324, 327, and 328, a selection transistor 330, an amplification transistor 331, and a dummy transistor 332.

Further, in the FD sharing block 350, photodiodes 351, 352, 356, and 359, an FD 355, and a transistor group are arranged. The transistor group in the FD sharing block 350 includes transfer transistors 353, 354, 357, and 358, a selection transistor 360, an amplification transistor 361, and a reset transistor 362.

Here, in the pixel array section 300, the number of rows is assumed to be N, the number of columns is assumed to be M (N and M are integers), the horizontal direction (row direction) is assumed to be an X direction, and the vertical direction (column direction) is assumed to be a Y direction. Further, an optical axis direction perpendicular to the X direction and the Y direction is assumed to be a Z direction. Moreover, the coordinates of a photodiode in the n-th row and the m-th column in the pixel array section 300 are represented by (n, m). Here, n is an integer from 0 to N−1, while m is an integer from 0 to M−1.

First, the layout of the elements in the Tr sharing block 310 will be described. The photodiodes 321, 322, 326, 329, 351, 352, 356, and 359 are arranged in two columns×four rows. The coordinates of the photodiodes 321, 322, 326, and 329 are, for example, (0, 0), (0, 1), (1, 0), and (1, 1), respectively. The coordinates of the photodiodes 351, 352, 356, and 359 are, for example, (2, 0), (2, 1), (3, 0), and (3, 1), respectively.

The FD 325 is arranged at a position surrounded by the photodiodes 321, 322, 326, and 329. The FD 355 is arranged at a position surrounded by the photodiodes 351, 352, 356, and 359. In other words, the FDs 325 and 355 are arranged in the Y direction. It is to be noted that the Y direction is an example of a predetermined direction described in claims.

The transfer transistor 323 is arranged between the photodiode 321 and the FD 325. The transfer transistor 324 is arranged between the photodiode 322 and the FD 325. The transfer transistor 327 is arranged between the photodiode 326 and the FD 325. The transfer transistor 328 is arranged between the photodiode 329 and the FD 325.

Further, the transfer transistor 353 is arranged between the photodiode 351 and the FD 355. The transfer transistor 354 is arranged between the photodiode 352 and the FD 355. The transfer transistor 357 is arranged between the photodiode 356 and the FD 355. The transfer transistor 358 is arranged between the photodiode 359 and the FD 355.

The selection transistor 330 is arranged between the photodiode 326 and the photodiode 351. The selection transistor 360 is arranged between the photodiode 356 at the coordinates (3, 0) and a photodiode (not depicted) at the coordinates (4, 0) in the next row. In other words, the selection transistors 330 and 360 are arranged in the Y direction. Further, the selection transistors 330 and 360 are connected in parallel.

The dummy transistor 332 is arranged between the photodiode 329 and the photodiode 352. The reset transistor 362 is arranged between the photodiode 359 at the coordinates (3, 1) and a photodiode (not depicted) at the coordinates (4, 1) in the next row. In other words, the dummy transistor 332 and the reset transistor 362 are arranged in the Y direction.

The amplification transistor 331 is arranged between the selection transistor 330 and the dummy transistor 332. The amplification transistor 361 is arranged between the selection transistor 360 and the reset transistor 362. In other words, the amplification transistors 331 and 361 are arranged in the Y direction. Further, the selection transistor 330, the amplification transistor 331, and the dummy transistor 332 are arranged in the X direction. The selection transistor 360, the amplification transistor 361, and the reset transistor 362 are also arranged in the X direction.

Next, functions of the elements in the Tr sharing block 310 will be described. The photodiodes 321, 322, 326, 329, 351, 352, 356, and 359 generate electric charge by photoelectrically converting incident light. It is to be noted that the photodiodes 321, 322, 326, and 329 are examples of first photoelectric conversion elements described in claims, while the photodiodes 351, 352, 356, and 359 are examples of second photoelectric conversion elements described in claims.

The transfer transistor 323 transfers electric charge from the photodiode 321 to the FD 325 according to a transfer signal from the vertical driving section 210. Similarly, the transfer transistors 324, 327, and 328 respectively transfer electric charge from the photodiodes 322, 326, and 329 to the FD 325 according to respective transfer signals. Further, the transfer transistors 353, 354, 357, and 358 respectively transfer electric charge from the photodiodes 351, 352, 356, and 359 to the FD 355 according to respective transfer signals.

It is to be noted that a circuit including the transfer transistors 323, 324, 327, and 328 is an example of a first transfer section described in claims, while a circuit including the transfer transistors 353, 354, 357, and 358 is an example of a second transfer section described in claims.

Each of the FDs 325 and 355 accumulates the transferred electric charge and generates a voltage corresponding to the amount of accumulated electric charge. It is to be noted that the FD 325 is an example of a first electric charge accumulating section described in claims, while the FD 355 is an example of a second electric charge accumulating section described in claims.

The amplification transistor 331 amplifies the voltage of each of the FDs 325 and 355. The amplification transistor 331 outputs a pixel signal having the amplified voltage to the selection transistor 330. The amplification transistor 361 amplifies the voltage of each of the FDs 325 and 355. The amplification transistor 361 outputs a pixel signal having the amplified voltage to the selection transistor 360. It is to be noted that the amplification transistor 331 is an example of a first transistor described in claims. Further, the amplification transistor 361 is an example of a second transistor described in claims.

The selection transistor 330 opens and closes a path between the amplification transistor 331 and a vertical signal line (not depicted) according to a selection signal from the vertical driving section 210. The pixel signal is output to the column processing section 230 through the vertical signal line. The selection transistor 360 opens and closes a path between the amplification transistor 361 and the vertical signal line (not depicted) according to the selection signal. It is to be noted that the selection transistor 330 is an example of a third transistor described in claims. Further, the selection transistor 360 is an example of a fourth transistor described in claims.

The reset transistor 362 extracts electric charge from the FDs 325 and 355 according to a reset signal from the vertical driving section 210, and initializes the amount of electric charge in the FDs 325 and 355.

The dummy transistor 332 is a transistor arranged in order to make the FD sharing block 320 and the FD sharing block 350 symmetrical to each other. The dummy transistor 332 may be driven or may just be arranged without being driven.

As described above, the selection transistor 330, the amplification transistor 331, and the dummy transistor 332 are arranged at the same relative positions as the selection transistor 360, the amplification transistor 361, and the reset transistor 362, respectively, in their respective FD sharing blocks. With this arrangement, the FD sharing block 320 and the FD sharing block 350 can be symmetrical to each other. This arrangement can reduce the influence caused by variation from pixel to pixel in the density of the polysilicon of the transistors and improve photo response non-uniformity (PRNU). Here, "symmetry" means that the arrangement layouts of the elements such as the transistors and the FDs have translational symmetry or line symmetry. In the example in FIG. 3, with the FD sharing block 320 translated toward the FD sharing block 350 along the Y direction, the layout of the FD sharing block 320 and the layout of the FD sharing block 350 become the same, that is, translationally symmetrical. It is to be noted that the FD sharing block 320 may be line symmetrical to the FD sharing block 350, as will be described later.

Here, if the transistors are arranged such that the FD sharing blocks are asymmetrical to each other, the sensitivity becomes different from pixel to pixel. For example, the following reason can be considered as the cause of the difference.

Of the light irradiated from a back surface, light passing through the vicinity of a gate, which includes, for example, polysilicon, of a MOS transistor is reflected and absorbed by an interface between the gate and silicon, a side wall of the gate, or the like. Therefore, the output is different between a photodiode with the gate of the MOS transistor arranged on the periphery thereof and a photodiode with the gate of the MOS transistor not arranged on the periphery thereof. This results in an output difference between these photodiodes.

Further, electrons generated by photoelectric conversion in a photodiode region close to a source and a drain of the MOS transistor are likely to move to the source and the drain having a relatively deeper potential than the potential of the photodiode. In this case, the electrons are difficult to be detected and the output becomes small in the photodiode with the source and the drain of the MOS transistor arranged on the periphery thereof. Therefore, the output is different between the photodiode with the source and the drain of the MOS transistor arranged on the periphery thereof and the photodiode with the source and the drain of the MOS transistor not arranged on the periphery thereof. This results in an output difference between these photodiodes.

Figure 4:
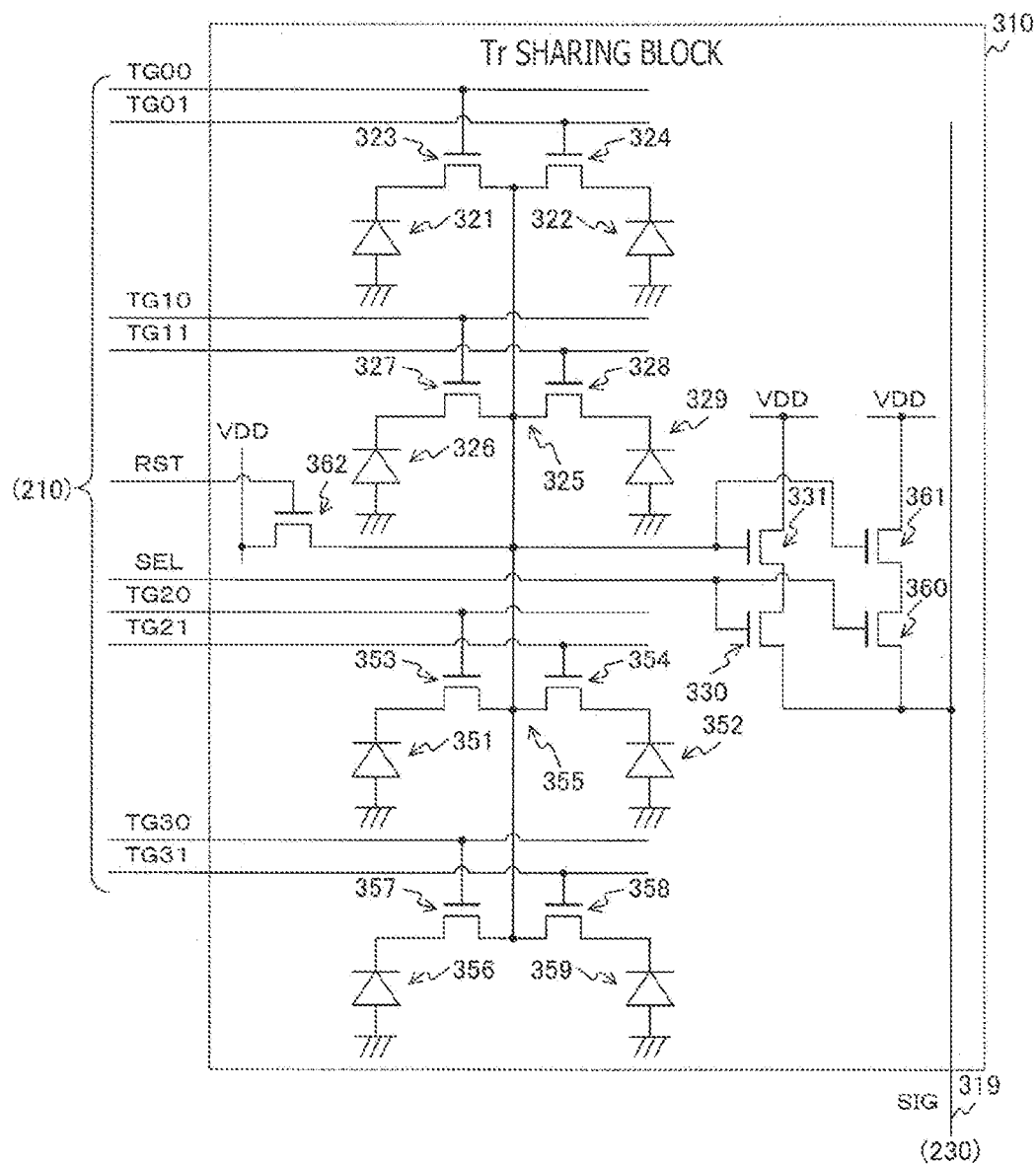
FIG. 4 is a circuit diagram depicting an example of an equivalent circuit of the Tr sharing block according to the first embodiment of the present technology.

FIG. 4 is a circuit diagram depicting an example of an equivalent circuit of the Tr sharing block 310 according to the first embodiment of the present technology. For example, n-type MOS (Metal-Oxide-Semiconductor) transistors are used as the transfer transistors 323, 324, 327, 328, 353, 354, 357, and 358. Similarly, for example, n-type MOS transistors are also used as the reset transistor 362, the amplification transistors 331 and 361, and the selection transistors 330 and 360.

Each gate of the transfer transistors 323, 324, 327, and 328 is connected to the vertical driving section 210. Further, sources and drains of these transistors are connected to the respective photodiodes and the FD 325. Further, each gate of the transfer transistors 353, 354, 357, and 358 is connected to the vertical driving section 210. Further, sources and drains of these transistors are connected to the respective photodiodes and the FD 355.

A gate of the reset transistor 362 is connected to the vertical driving section 210. A source of the reset transistor 362 is connected to a power supply, while a drain thereof is connected to the FDs 325 and 355.

Gates of the amplification transistors 331 and 361 are commonly connected to the FDs 325 and 355. Further, a source of the amplification transistor 331 is connected to the power supply, while a drain thereof is connected to the selection transistor 330. A source of the amplification transistor 361 is connected to the power supply, while a drain thereof is connected to the selection transistor 360. In other words, the amplification transistors 331 and 361 are connected in parallel to the power supply.

Gates of the selection transistors 330 and 360 are commonly connected to the vertical driving section 210. Further, a source of the selection transistor 330 is connected to the amplification transistor 331, while a drain thereof is connected to a vertical signal line 319. A source of the selection transistor 360 is connected to the amplification transistor 361, while a drain thereof is connected to the vertical signal line 319. In other words, the selection transistors 330 and 360 are connected in parallel to the vertical signal line. A pixel signal SIG is output to the column processing section 230 through this vertical signal line.

The vertical driving section 210 initializes the FDs 325 and 355 by supplying a reset signal RST. Further, the vertical driving section 210 supplies transfer signals TG00, TG01, TG10, TG11, TG20, TG21, TG30, and TG31 to the transfer transistors 323, 324, 327, 328, 353, 354, 357, and 358, respectively, to cause the transfer transistors 323, 324, 327, 328, 353, 354, 357, and 358 to transfer electric charge. In a case where pixel addition is not performed, the vertical driving section 210 sequentially supplies the transfer signals TG00, TG01, TG10, TG11, TG20, TG21, TG30, and TG31 at the end of exposure. On the other hand, in a case where pixel addition is performed, the vertical driving section 210 simultaneously supplies at least two of the transfer signals TG00, TG01, TG10, TG11, TG20, TG21, TG30, or TG31. Further, the vertical driving section 210 supplies a selection signal SEL to the selection transistors 330 and 360 to cause the selection transistors 330 and 360 to output the pixel signals to the vertical signal line 319.

Figure 5:
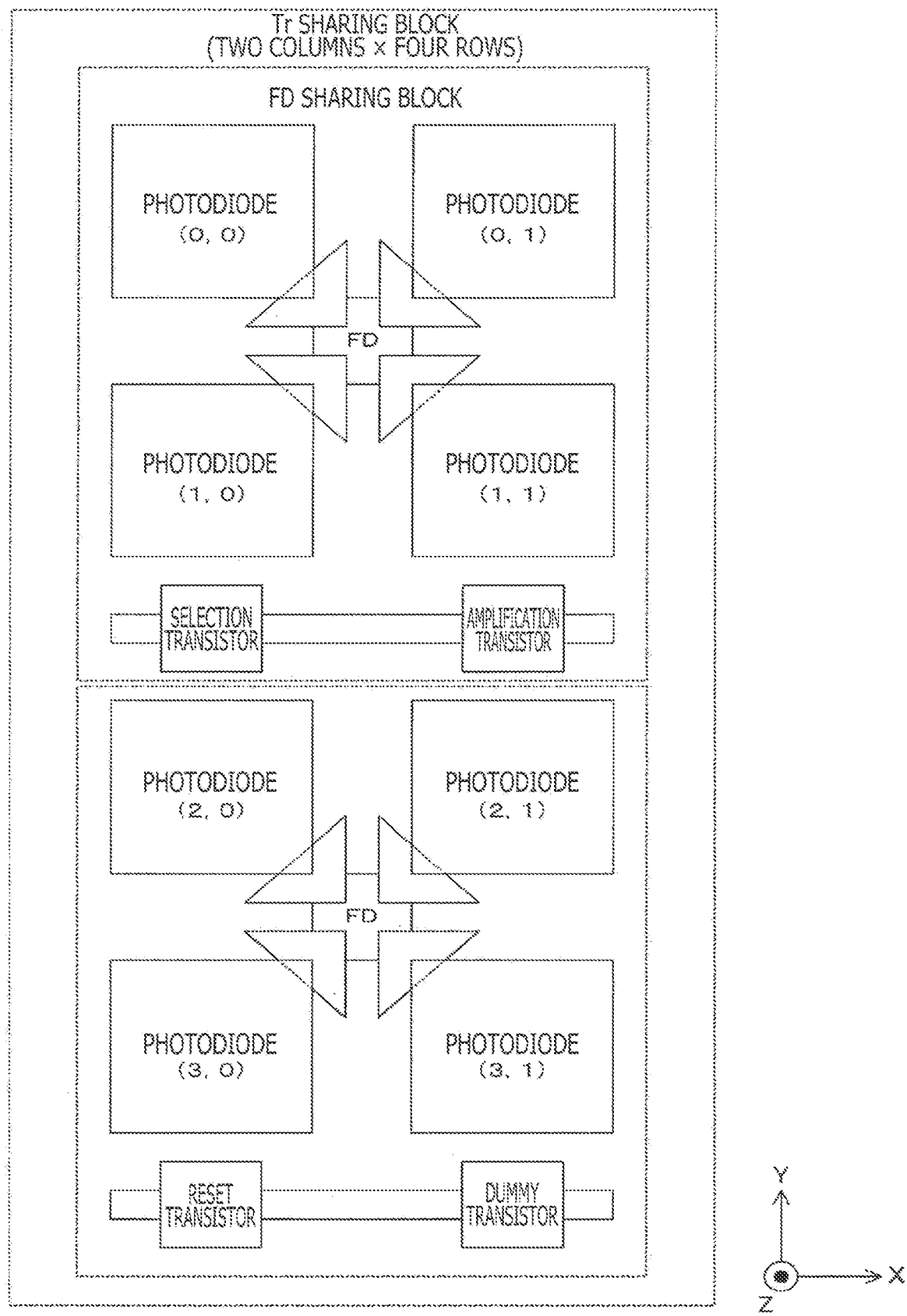
FIG. 5 is a plan view depicting an example of a layout of elements in a Tr sharing block in a comparative example.

FIG. 5 is a plan view depicting an example of a layout of elements in a Tr sharing block in a comparative example. In this comparative example, one selection transistor and one amplification transistor are provided. The selection transistor is arranged between a photodiode at the coordinates (1, 0) and a photodiode at the coordinates (2, 0). A reset transistor is arranged between a photodiode at the coordinates (3, 0) and a photodiode (not depicted) at the coordinates (4, 0). The amplification transistor is arranged between a photodiode at the coordinates (1, 1) and a photodiode at the coordinates (2, 1). A dummy transistor is arranged between a photodiode at the coordinates (3, 1) and a photodiode (not depicted) at the coordinates (4, 1).

Figure 6:
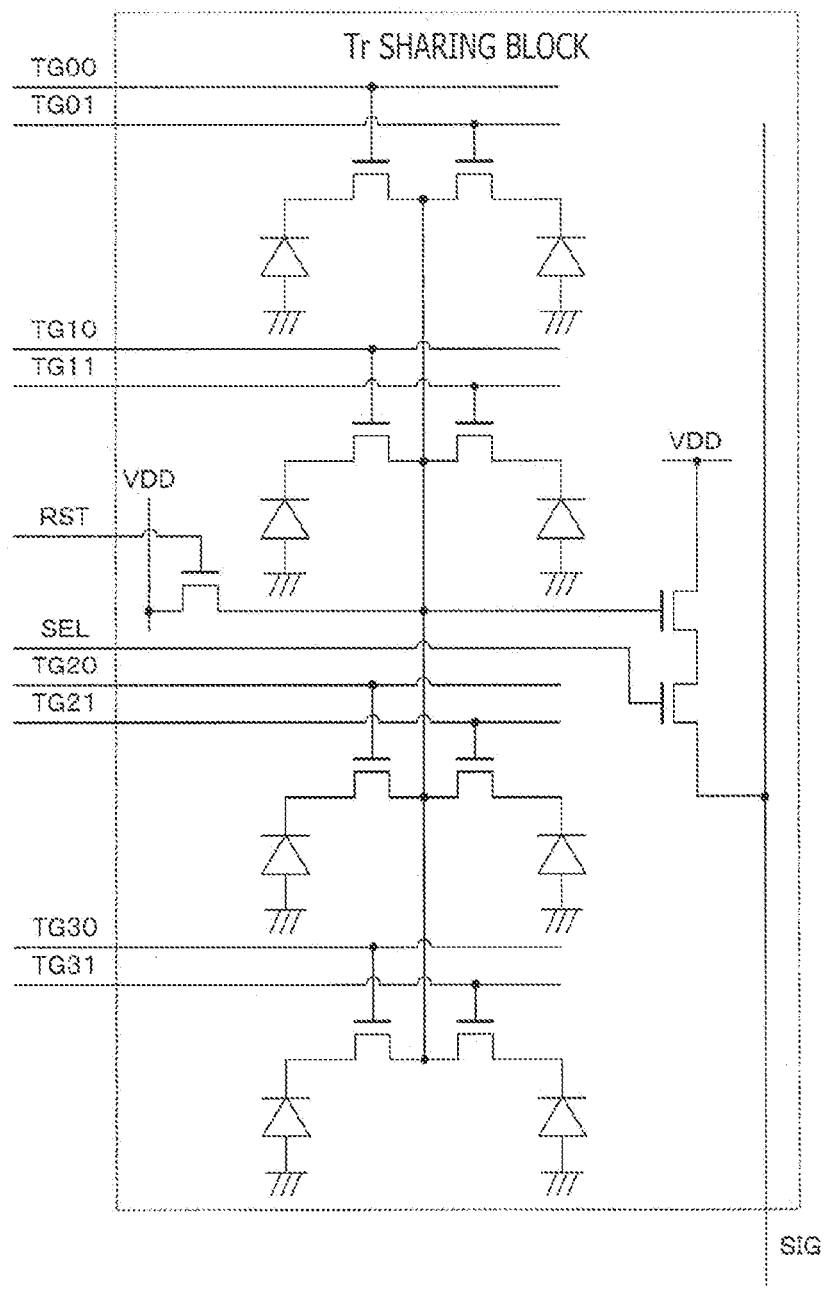
FIG. 6 is a circuit diagram depicting an example of an equivalent circuit of the Tr sharing block in the comparative example.

FIG. 6 is a circuit diagram depicting an example of an equivalent circuit of the Tr sharing block in the comparative example. A gate of the amplification transistor is connected to the FDs. The amplification transistor and the selection transistor are connected in series between a power supply and a vertical signal line. A drain current Isf of the amplification transistor in this comparative example is represented by the following formula, for example.

$$Isf = K \cdot (W/L) \cdot (Vin - V2 - Vth)^2 \quad \text{Formula 1}$$

In the above-described formula, K represents the product of the mobility of the amplification transistor and the gate capacitance. W represents the gate width. L represents the gate length of the amplification transistor. Vin represents a gate voltage of the amplification transistor. V2 represents a voltage at a connection point between the amplification transistor and the selection transistor. The unit of the drain current Isf is, for example, an ampere (A). The unit of the gate length L and the gate width W is, for example, a meter (m). The unit of the voltages Vin, V2, and Vth is, for example, a volt (V).

Next, assume a configuration in which two amplification transistors 331 are included in the comparative example and one of the two amplification transistors 331 is connected in parallel to one selection transistor. A drain current Isf' of the amplification transistor in this configuration is represented by the following formula, for example.

$$Isf' = K \cdot (2W/L) \cdot (Vin - V2' - Vth')^2 \quad \text{Formula 2}$$

V2' in the above-described formula represents a voltage between the amplification transistor and the selection transistor. Vth' is a threshold voltage of the amplification transistor.

According to the formulas 1 and 2, in a case where V2 and Vth are assumed to be equal to V2' and Vth', respectively, the parallel connection of the amplification transistors makes it possible to obtain the same drain current as the drain current to be obtained in a case where the gate width W of the amplification transistor is doubled.

Further, in a case where Isf and Vth are assumed to be equal to Isf' and Vth', respectively, the voltage V2' becomes larger than the voltage V2 according to the formulas 1 and 2. This means that the parallel connection increases the mutual conductance of the amplification transistors, reducing the on-resistance thereof.

As described above, the parallel connection of the amplification transistors can increase the mutual conductance of these transistors and increase the drain current, as compared with a case where parallel connection is not employed. This applies similarly to the selection transistor and the parallel connection can increase the drain current. Further, an increase in the mutual conductance can increase the processing speed.

A similar effect can also be obtained in a case where the gate width W of the amplification transistor is doubled without connecting the amplification transistors in parallel. However, in order to secure the doubled gate width W, there is a possibility that the light receiving areas of the photodiodes need to be reduced. Moreover, a reduction in the light receiving areas results in a reduction in the optical characteristics such as sensitivity.

By contrast, the amplification transistors 331 and 361 are connected in parallel in the solid-state imaging element 200. While the light receiving areas are maintained, this arrangement can attain a substantially increased gate width W of the amplification transistor, as compared with a case where parallel connection is not employed. Further, the selection transistors 330 and 360 are connected in parallel. This arrangement can also attain a substantially increased gate width W of the selection transistor.

Further, the amplification transistors 331 and 361 connected in parallel are arranged in the Y direction in the Tr sharing block 310. Similarly, the selection transistors 330 and 360 are also arranged in the Y direction. The arrangement in the Y direction facilitates wiring of signal lines, as compared with the arrangement in the X direction. The wiring layout will be described later.

Figure 7:
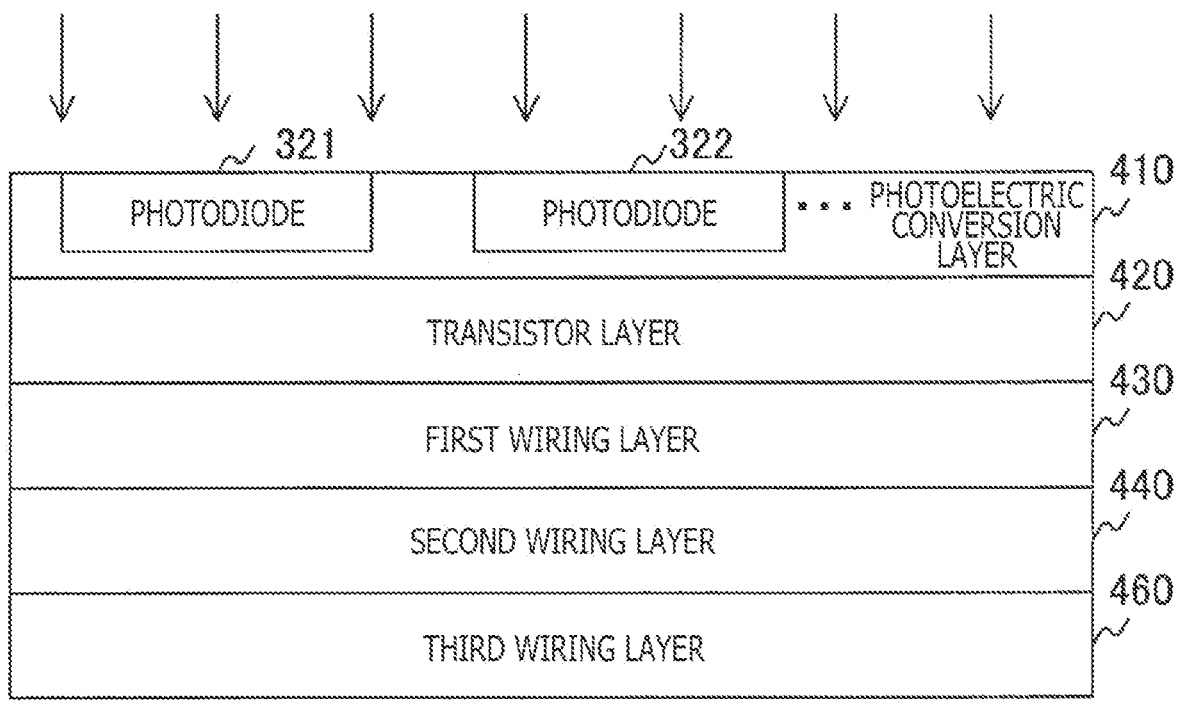
FIG. 7 is a diagram depicting an example of a cross-sectional view of the solid-state imaging element according to the first embodiment of the present technology.
Figure 7:
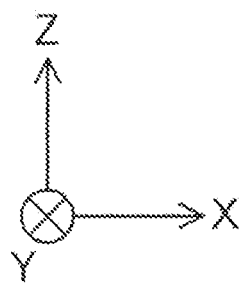

FIG. 7 is a diagram depicting an example of a cross-sectional view of the solid-state imaging element 200 according to the first embodiment of the present technology viewed from the Y direction. With a light-receiving surface of a photoelectric conversion layer 410 serving as an upper surface, a transistor layer 420 is provided below the photoelectric conversion layer 410. Further, a first wiring layer 430 is provided below the transistor layer 420, and a second wiring layer 440 is provided below the first wiring layer 430. A third wiring layer 460 is provided below the second wiring layer 440.

In the photoelectric conversion layer 410, the photodiodes 321 and 322 are arranged in a two-dimensional grid. In the transistor layer 420, the transistors such as the amplification transistors 331 and 361 and the selection transistors 330 and 360 are provided. In the first wiring layer 430, signal lines are wired along the Y direction (vertical direction). In the second wiring layer 440, signal lines are wired along the X direction (horizontal direction). In the third wiring layer 460, signal lines are wired along the Y direction.

Figure 8:
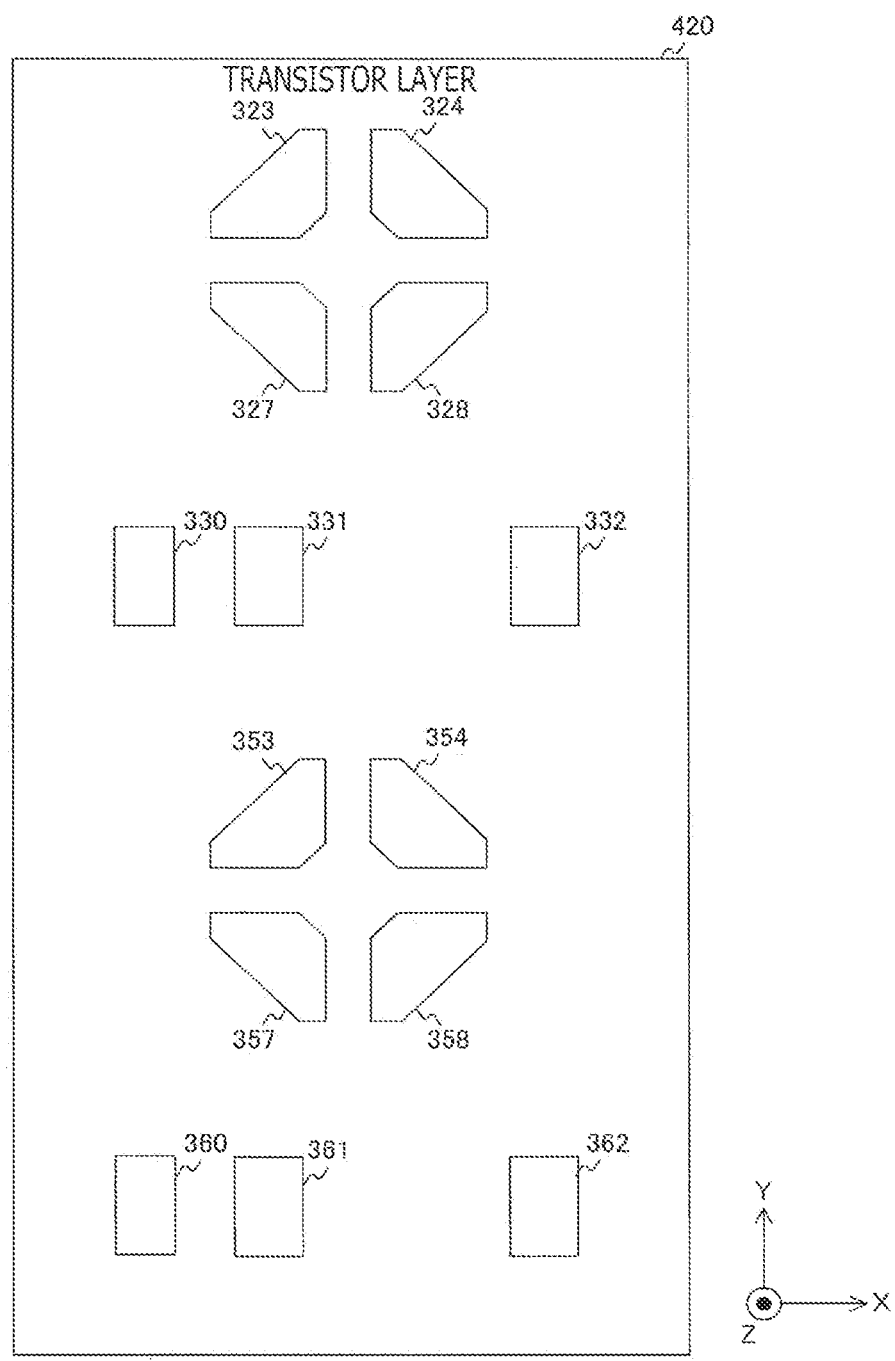
FIG. 8 is a plan view depicting an example of a transistor layer according to the first embodiment of the present technology.

FIG. 8 is a plan view depicting an example of the transistor layer 420 according to the first embodiment of the present technology. In a region corresponding to the Tr sharing block 310 in the transistor layer 420, the eight transfer transistors, the selection transistors 330 and 360, the amplification transistors 331 and 361, the dummy transistor 332, and the reset transistor 362 are provided.

[Example of Configuration of Wiring Layer]

Figure 9:
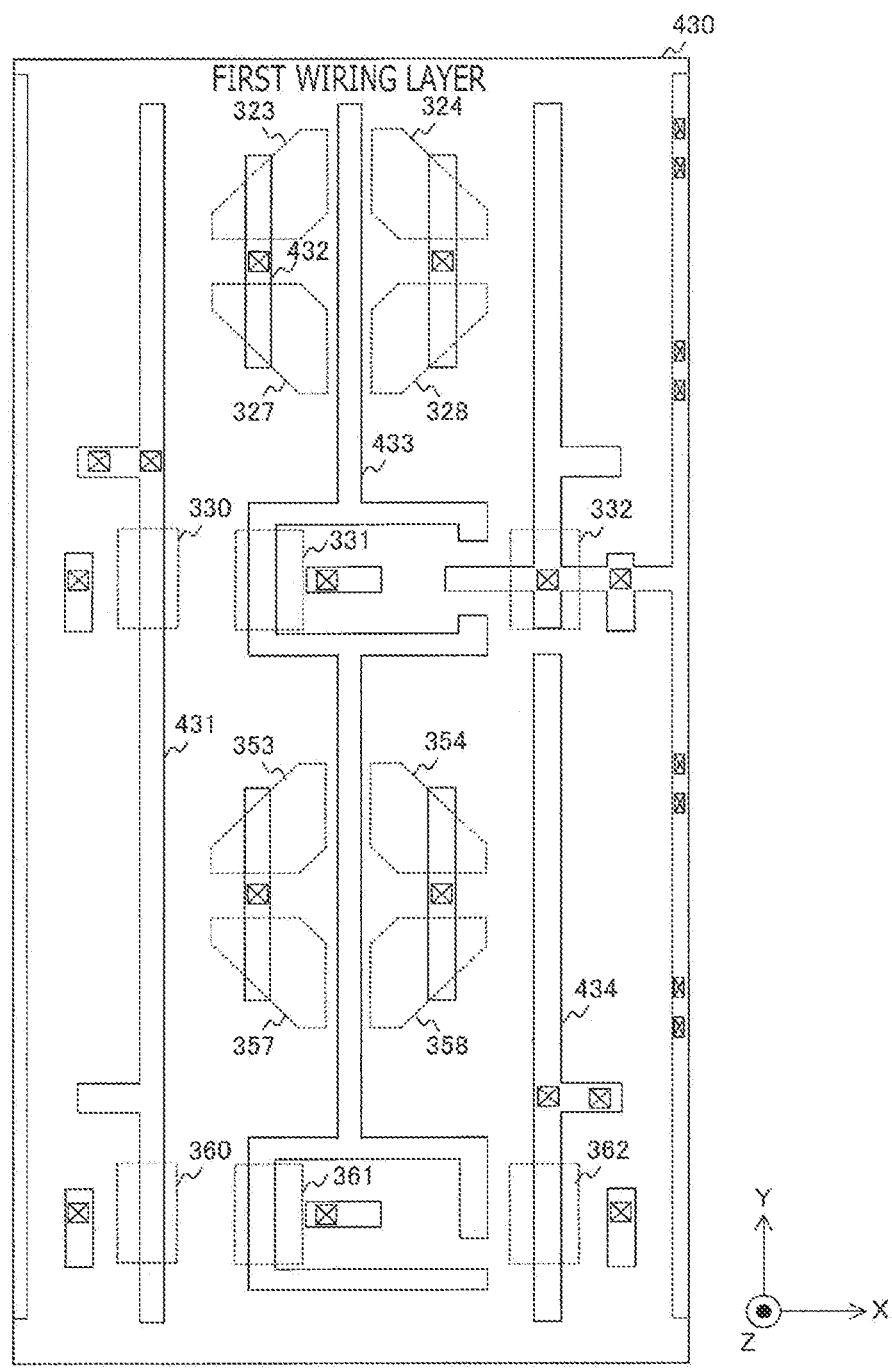
FIG. 9 is a plan view depicting an example of a wiring layout of a first wiring layer according to the first embodiment of the present technology.

FIG. 9 is a plan view depicting an example of a wiring layout of the first wiring layer 430 according to the first embodiment of the present technology. In the first wiring layer 430, signal lines such as signal lines 431, 432, 433, and 434 are wired along the Y direction.

The signal line 431 is connected to the selection transistors 330 and 360 and transmits the selection signal SEL to the selection transistors 330 and 360. The signal line 432 is connected to the transfer transistors 323 and 327 and transmits the transfer signals TG00 and TG10 to the transfer transistors 323 and 327, respectively.

The signal line 433 is connected to the amplification transistors 331 and 361 and is used to supply power to the amplification transistors 331 and 361. The signal line 434 is connected to the reset transistor 362 and transmits the reset signal RST to the reset transistor 362.

Figure 10:
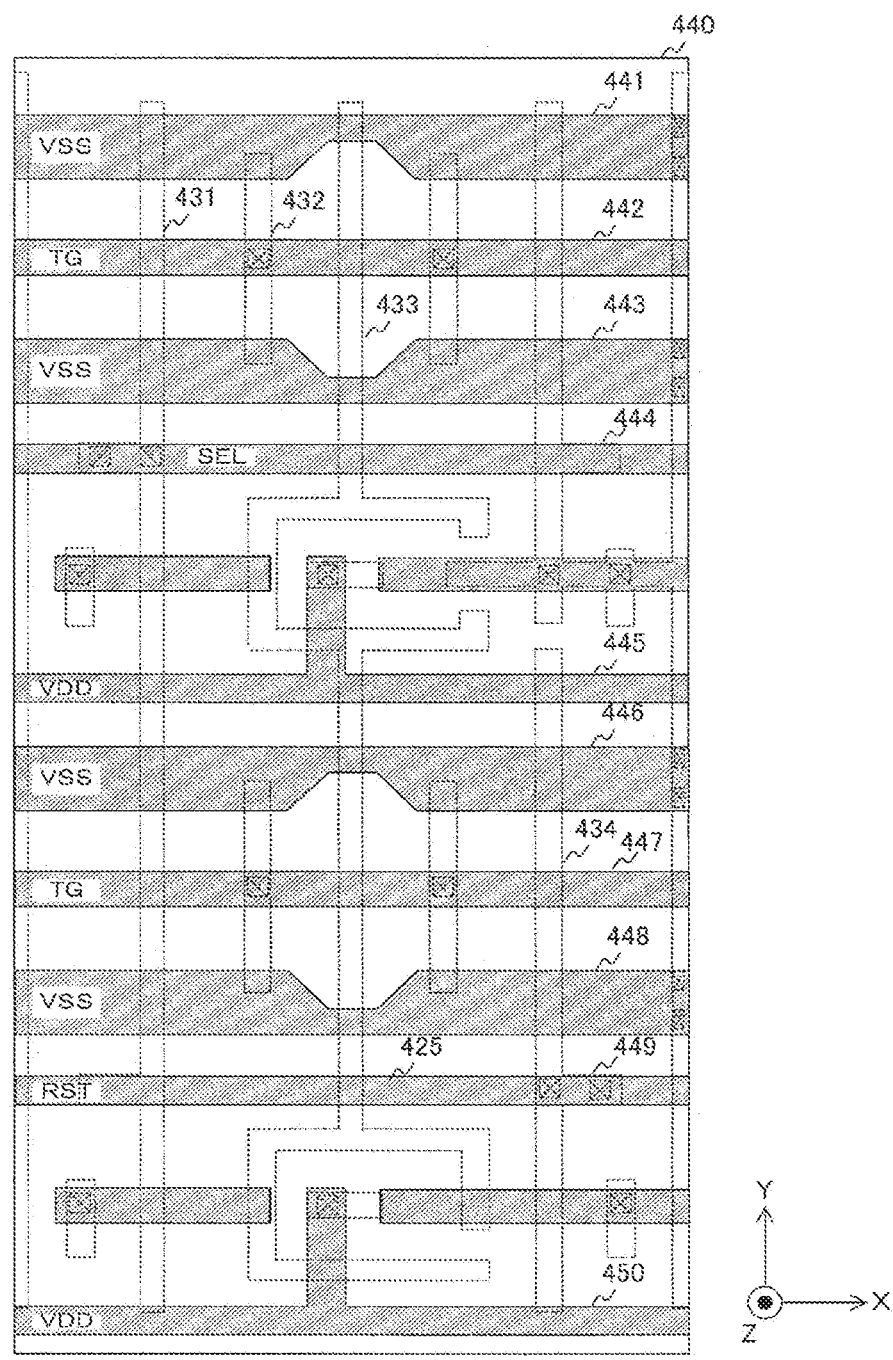
FIG. 10 is a plan view depicting an example of a wiring layout of a second wiring layer according to the first embodiment of the present technology.

FIG. 10 is a plan view depicting an example of a wiring layout of the second wiring layer 440 according to the first embodiment of the present technology. In the second wiring layer 440, signal lines such as signal lines 441, 442, 443, 444, 445, 446, 447, 448, 449, and 450 are wired along the X direction.

The signal lines 441, 443, 446, and 448 are used to supply a power supply voltage VSS. The signal line 442 is connected to the signal line 432 and transmits the transfer signals TG from the vertical driving section 210 to the signal line 432. Similarly, the signal line 447 transmits the transfer signals TG.

The signal line 444 is connected to the signal line 431 and transmits the selection signal SEL from the vertical driving section 210 to the signal line 431. The signal lines 445 and 450 are used to supply a power supply voltage VDD.

The signal line 449 is connected to the signal line 434 and transmits the reset signal RST from the vertical driving section 210 to the signal line 434.

As described above, since the selection transistors 330 and 360 are arranged in the Y direction, the selection signal SEL can be transmitted through the single signal line 431 wired along the Y direction. Here, if the selection transistors 330 and 360 are arranged in the X direction, the selection signal SEL needs to be transmitted through two signal lines connected to the signal line 444 in the first wiring layer 430, and this results in an increase in the number of wires. By contrast, the selection transistors 330 and 360 are arranged in the Y direction in the Tr sharing block 310. This allows a reduction in the number of wires in the first wiring layer 430 and facilitating wiring, as compared with a case where the selection transistors 330 and 360 are arranged in the X direction.

Figure 11:
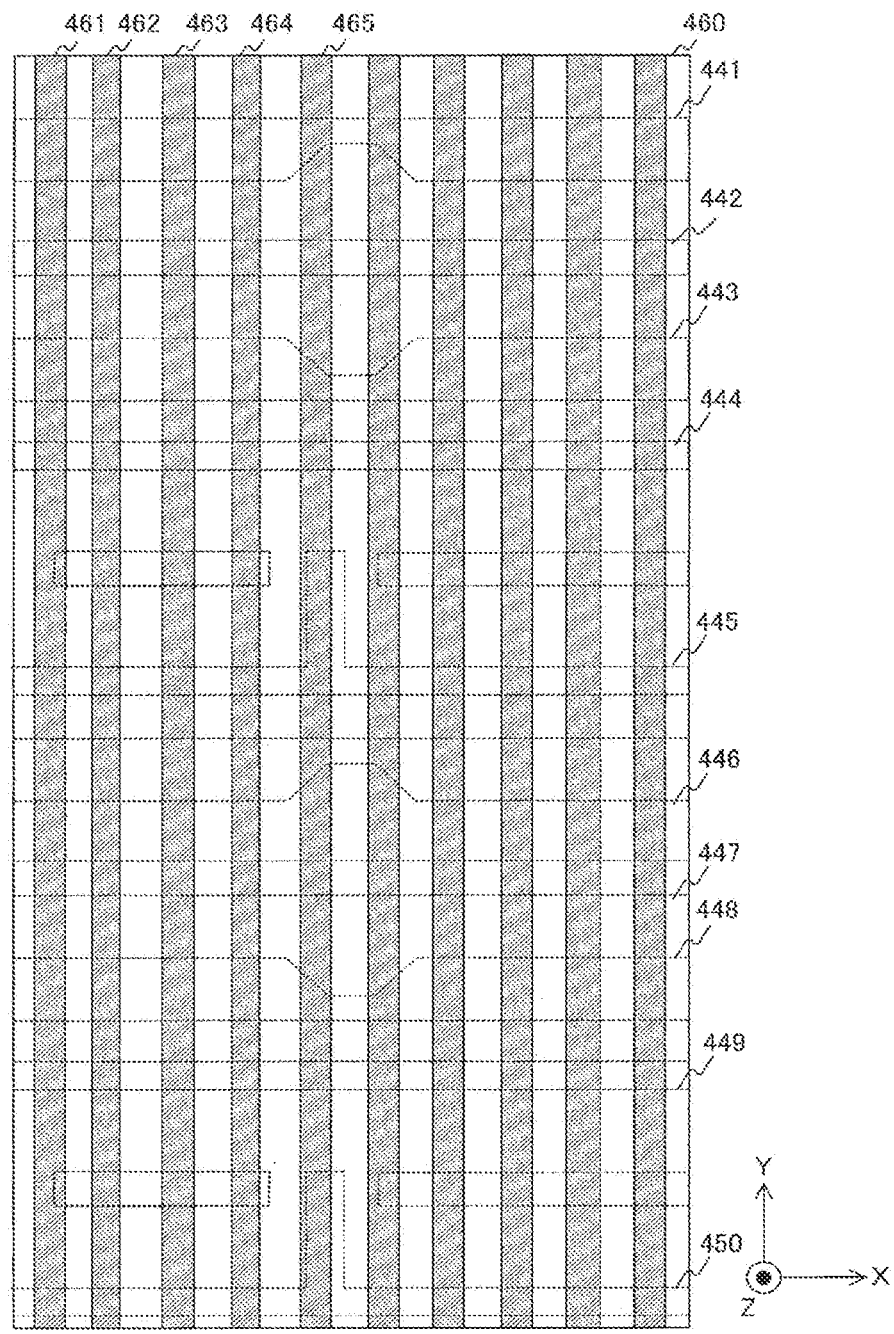
FIG. 11 is a plan view depicting an example of a wiring layout of a third wiring layer according to the first embodiment of the present technology.

FIG. 11 is a plan view depicting an example of a wiring layout of the third wiring layer 460 according to the first embodiment of the present technology. In the third wiring layer 460, signal lines such as signal lines 461, 462, 463, 464, and 465 are wired along the Y direction.

The signal lines 461 and 465 are used to supply the power supply voltage VDD. The signal lines 462 and 464 are used to supply the power supply voltage VSS. The signal line 463 transmits the pixel signal SIG. The signal line 463 in FIG. 11 corresponds to the vertical signal line 319 in the equivalent circuit depicted as an example in FIG. 4.

According to the first embodiment of the present technology, as described above, the amplification transistors 331 and 361 are connected in parallel and arranged in the Y direction. This arrangement can easily attain an increased driving force of the amplification transistor, as compared with a case where parallel connection is not employed. Further, the selection transistors 330 and 360 are also connected in parallel. This arrangement can also attain an increased driving force of the selection transistor.

2. Second Embodiment

In the first embodiment described above, the two amplification transistors 331 and 361 are connected in parallel in the solid-state imaging element 200. Accordingly, the gate width W of the amplification transistors can be substantially twice as large as a case where parallel connection is not employed. However, even with the doubled gate width W, the driving force of the amplification transistors may be insufficient in some cases. The solid-state imaging element 200 according to the second embodiment is different from the solid-state imaging element 200 according to the first embodiment in that the driving force of the amplification transistors is further improved.

Figure 12:
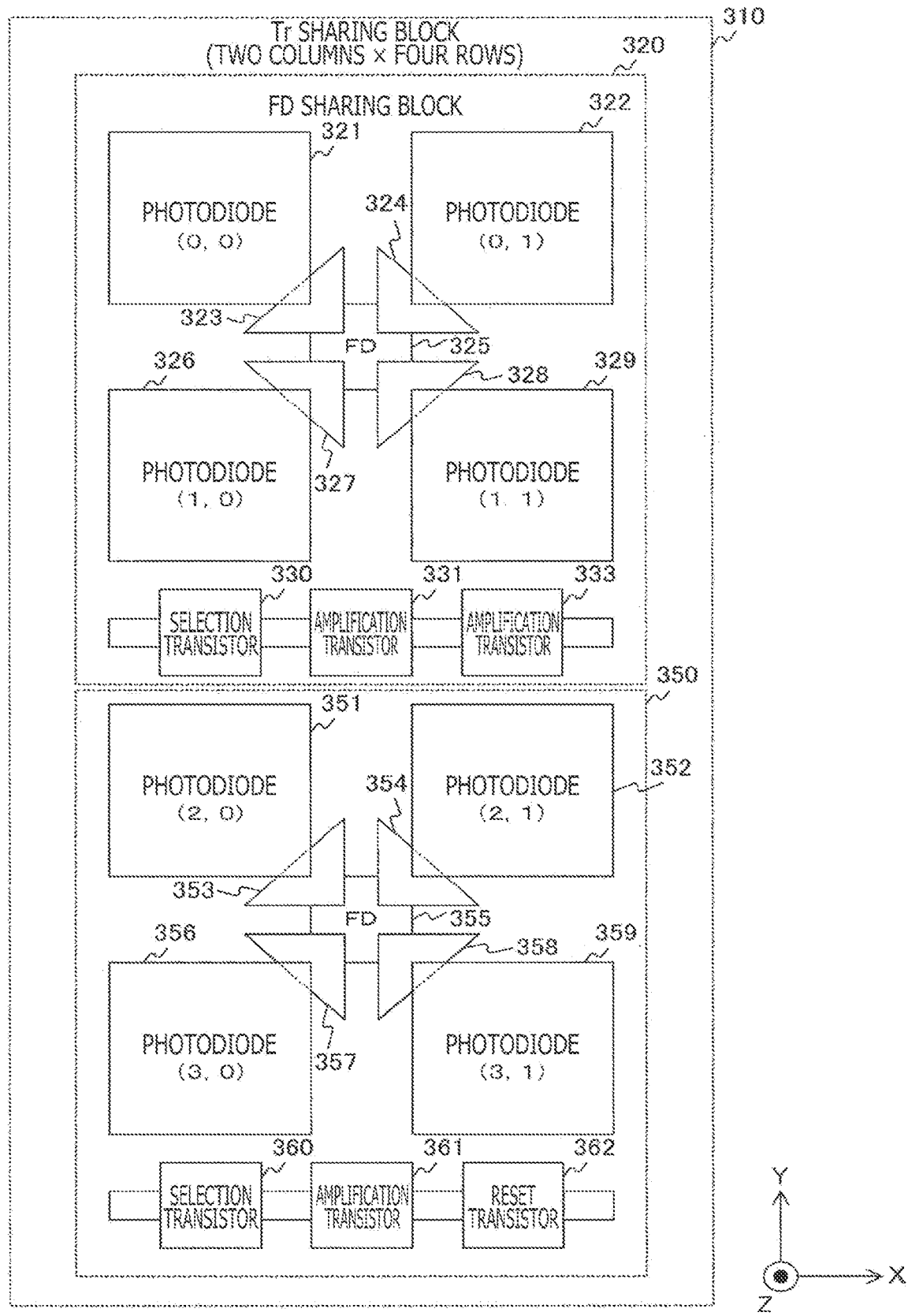
FIG. 12 is a plan view depicting an example of a layout of the elements in the Tr sharing block according to a second embodiment of the present technology.

FIG. 12 is a plan view depicting an example of a layout of the elements in the Tr sharing block 310 according to the second embodiment of the present technology. The Tr sharing block 310 according to the second embodiment is different from the Tr sharing block 310 according to the first embodiment in that an amplification transistor 333 is provided instead of the dummy transistor 332. Further, the amplification transistors 331, 361, and 333 are connected in parallel.

Figure 13:
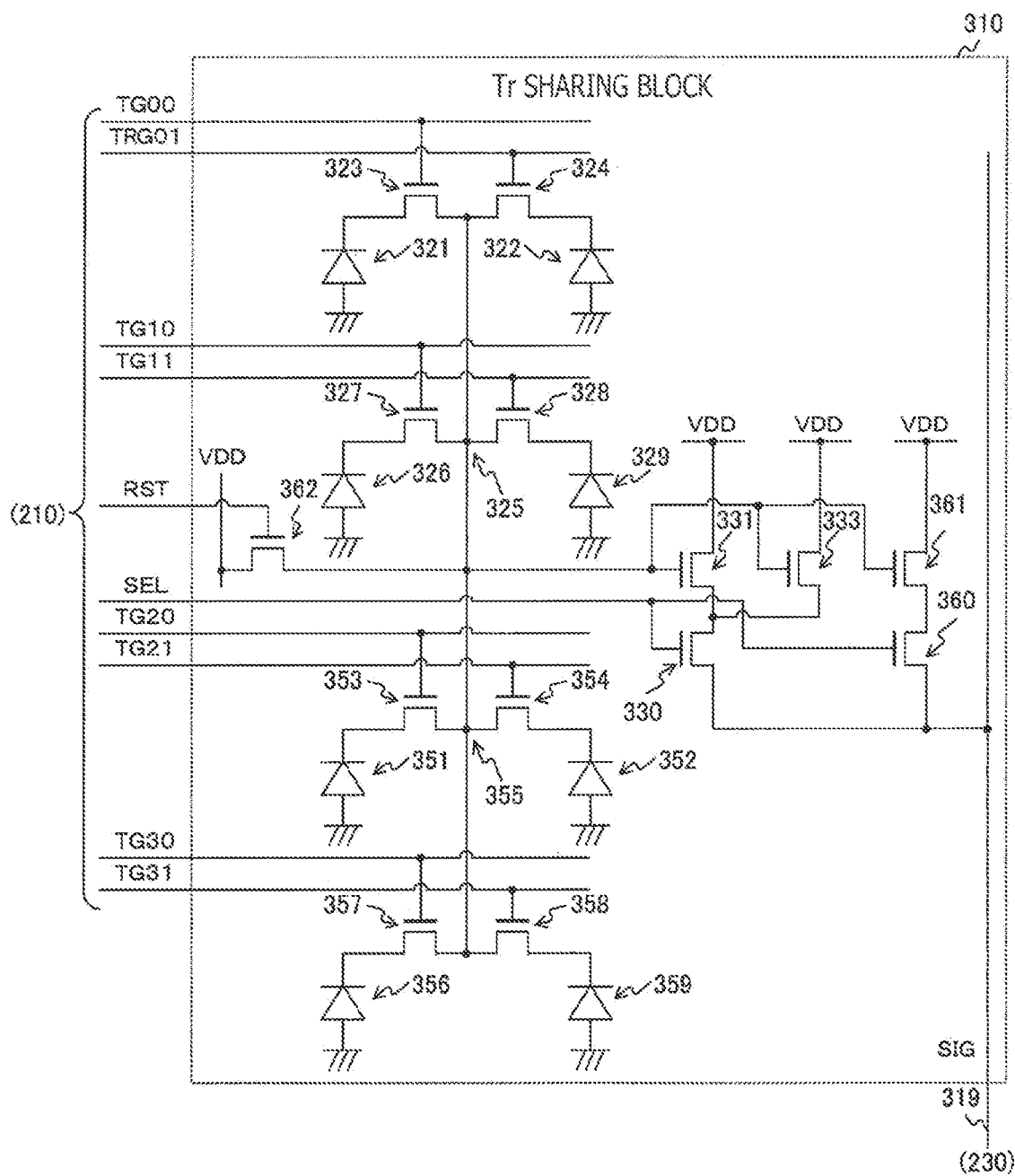
FIG. 13 is a circuit diagram depicting an example of an equivalent circuit of the Tr sharing block according to the second embodiment of the present technology.

FIG. 13 is a circuit diagram depicting an example of an equivalent circuit of the Tr sharing block 310 according to the second embodiment of the present technology. The equivalent circuit according to the second embodiment is different from the equivalent circuit according to the first embodiment in that the amplification transistor 333 is further connected.

Sources of the amplification transistors 331, 361, and 333 are commonly connected to the power supply. Further, drains of the amplification transistors 331 and 333 are commonly connected to the selection transistor 330. It is to be noted that the amplification transistor 333 is an example of a fifth transistor described in claims.

The three amplification transistors are connected in parallel. Accordingly, the gate width W of the amplification transistors can be substantially three times as large as a case where parallel connection is not employed. As a result, the drain current can be tripled and the driving force of the amplification transistors can be further improved.

In the second embodiment of the present technology, as described above, since the three amplification transistors 331, 361, and 333 are connected in parallel, the driving force of the amplification transistors can be further improved, as compared with a case where the two amplification transistors are connected in parallel.

3. Third Embodiment

In the first embodiment described above, the two selection transistors 330 and 360 are connected in parallel in the solid-state imaging element 200. Accordingly, the gate width W of the selection transistors can be substantially twice as large as a case where parallel connection is not employed. However, even with the doubled gate width W, the driving force of the selection transistors may be insufficient in some cases. The solid-state imaging element 200 according to the third embodiment is different from the solid-state imaging element 200 according to the first embodiment in that the driving force of the selection transistors is further improved.

Figure 14:
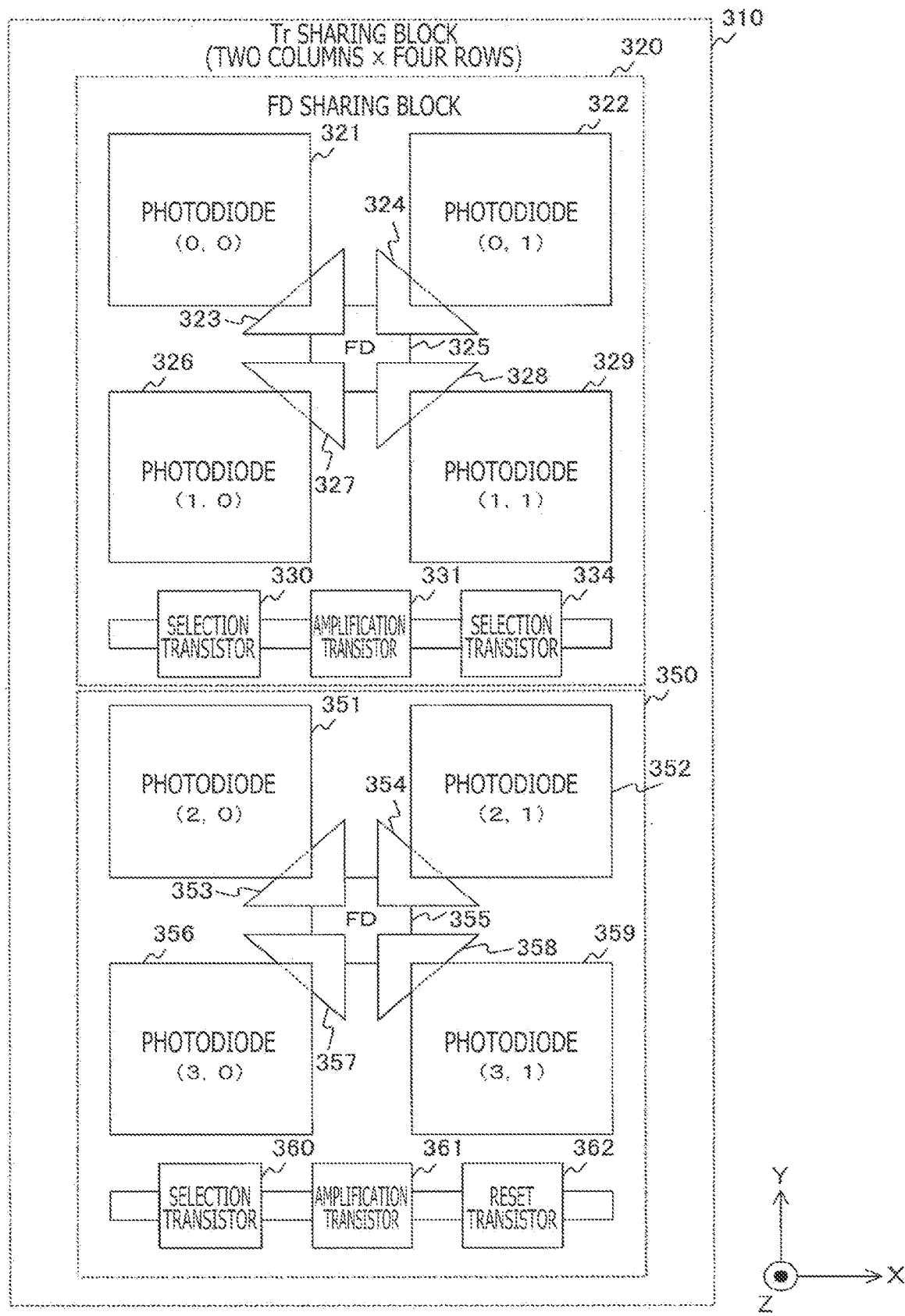
FIG. 14 is a plan view depicting an example of a layout of the elements in the Tr sharing block according to a third embodiment of the present technology.

FIG. 14 is a plan view depicting an example of a layout of the elements in the Tr sharing block 310 according to the third embodiment of the present technology. The Tr sharing block 310 according to the third embodiment is different from the Tr sharing block 310 according to the first embodiment in that a selection transistor 334 is provided instead of the dummy transistor 332. Further, the selection transistors 330, 360, and 334 are connected in parallel.

Figure 15:
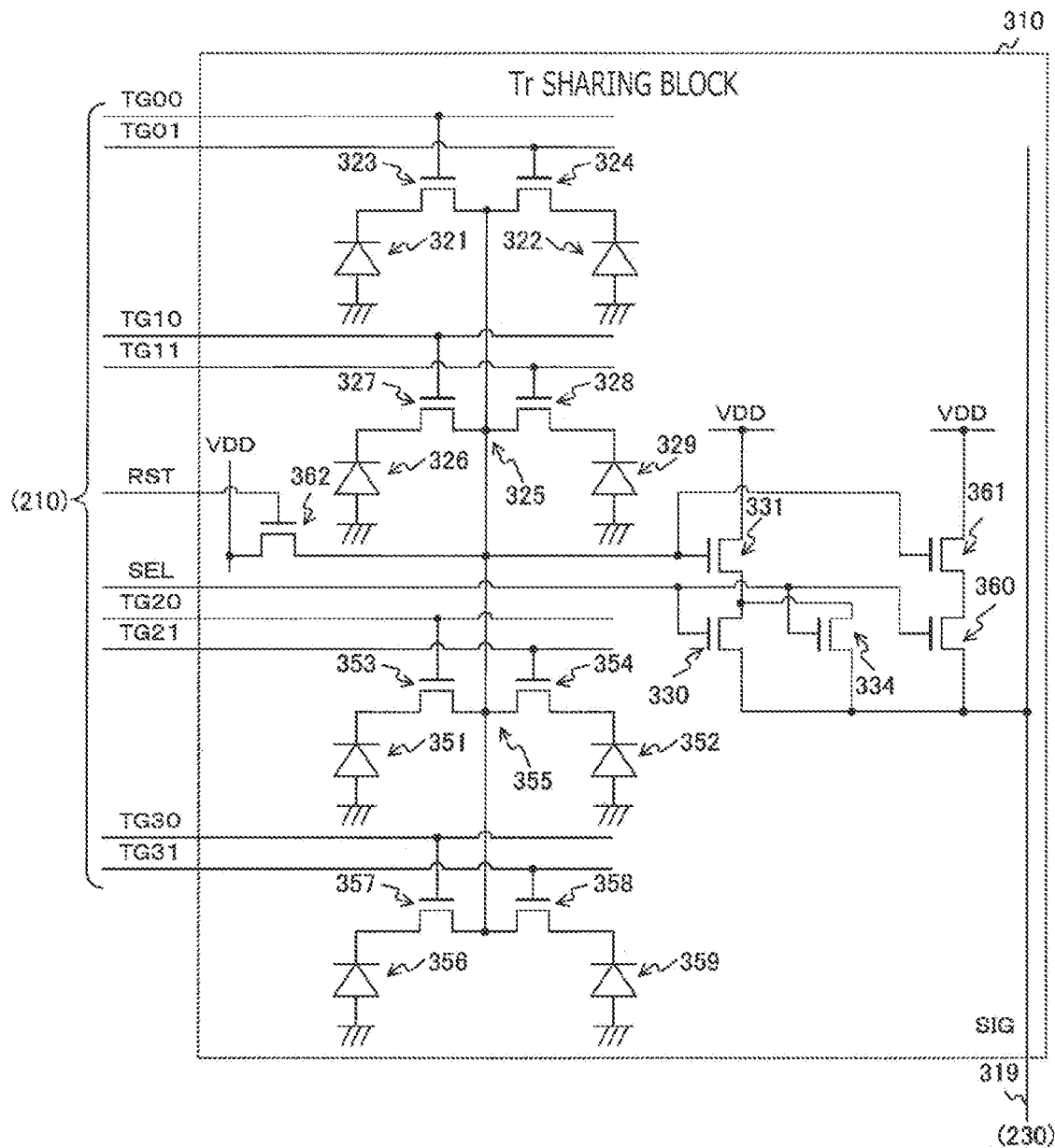
FIG. 15 is a circuit diagram depicting an example of an equivalent circuit of the Tr sharing block according to the third embodiment of the present technology.

FIG. 15 is a circuit diagram depicting an example of an equivalent circuit of the Tr sharing block 310 according to the third embodiment of the present technology. The equivalent circuit according to the third embodiment is different from the equivalent circuit according to the first embodiment in that the selection transistor 334 is further connected.

Gates of the selection transistors 330, 360, and 334 are commonly connected to the signal line that transmits the selection signal SEL, while drains thereof are commonly connected to the vertical signal line 319. Further, sources of the selection transistors 330 and 334 are commonly connected to the amplification transistor 331. It is to be noted that the selection transistor 334 is an example of the fifth transistor described in claims.

The three selection transistors are connected in parallel. Accordingly, the gate width W of the selection transistors can be substantially three times as large as a case where parallel connection is not employed. As a result, the drain current can be tripled and the driving force of the selection transistors can be further improved.

In the third embodiment of the present technology, as described above, since the three selection transistors 330, 360, and 334 are connected in parallel, the driving force of the selection transistors can be further improved, as compared with a case where the two selection transistors are connected in parallel.

4. Fourth Embodiment

In the first embodiment described above, the two selection transistors 330 and 360 are connected in parallel. Accordingly, the gate width W of the selection transistors can be substantially twice as large as a case where parallel connection is not employed. However, an increase in the number of transistors in the Tr sharing block 310 makes it difficult to increase the light receiving areas of the photodiodes. The solid-state imaging element 200 according to the fourth embodiment is different from the solid-state imaging element 200 according to the first embodiment in that the number of selection transistors is reduced.

Figure 16:
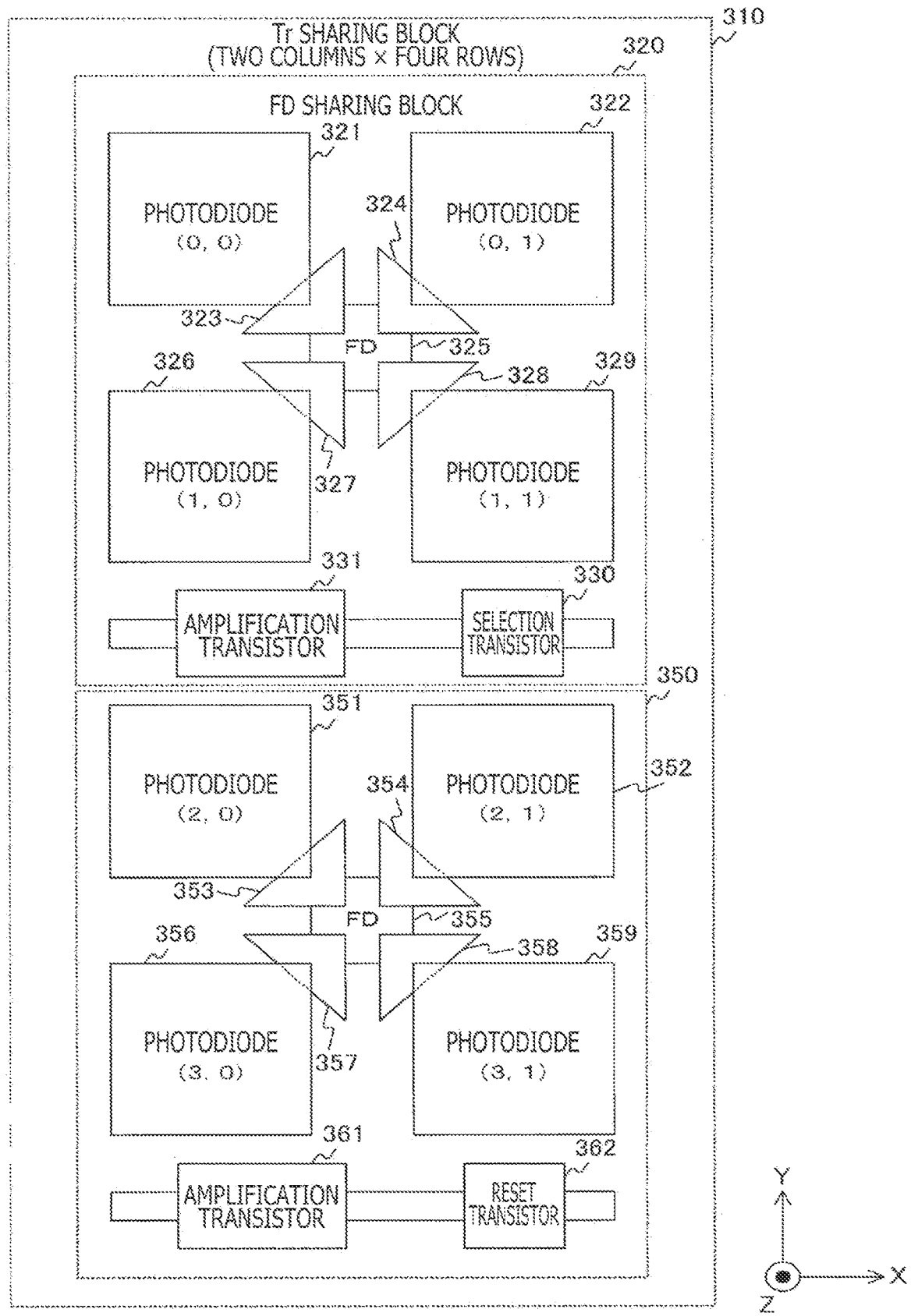
FIG. 16 is a plan view depicting an example of a layout of the elements in the Tr sharing block according to a fourth embodiment of the present technology.

FIG. 16 is a plan view depicting an example of a layout of the elements in the Tr sharing block 310 according to the fourth embodiment of the present technology. The Tr sharing block 310 according to the fourth embodiment is different from the Tr sharing block 310 according to the first embodiment in that the selection transistor 360 and the dummy transistor 332 are not provided. Since the FD sharing blocks 320 and 350 with these transistors reduced are symmetrical to each other, the optical characteristics such as PRNU can be improved. Further, in the fourth embodiment, the amplification transistor 331 is arranged between the photodiode 326 and the photodiode 351. The selection transistor 330 is arranged between the photodiode 329 and the photodiode 352. The amplification transistor 361 is arranged between the photodiode 356 at the coordinates (3, 0) and the photodiode (not depicted) at the coordinates (4, 0) in the next row. The position of the reset transistor 362 according to the fourth embodiment is similar to the position of the reset transistor 362 according to the first embodiment.

Figure 17:
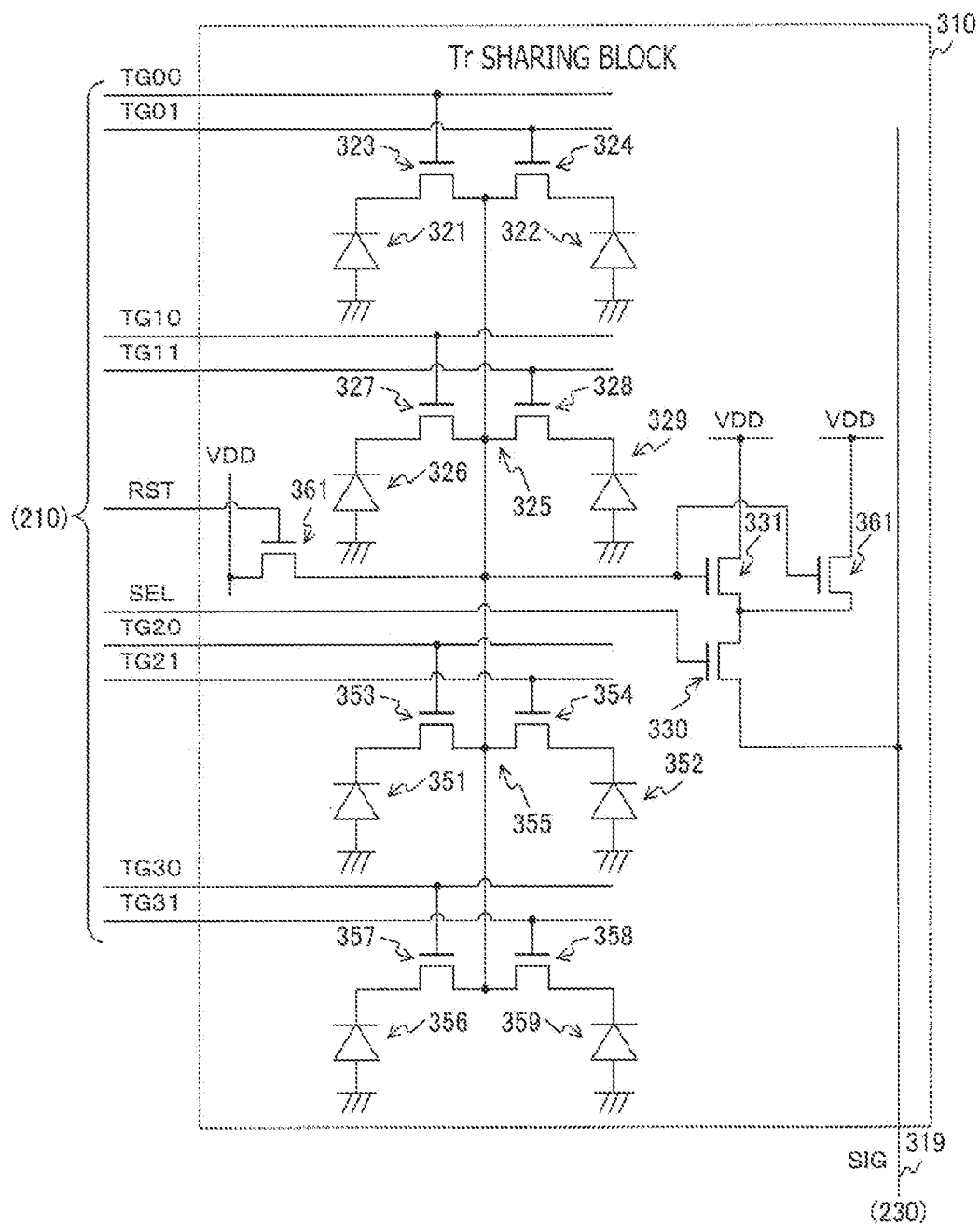
FIG. 17 is a circuit diagram depicting an example of an equivalent circuit of the Tr sharing block according to the fourth embodiment of the present technology.

FIG. 17 is a circuit diagram depicting an example of an equivalent circuit of the Tr sharing block 310 according to the fourth embodiment of the present technology. The equivalent circuit according to the fourth embodiment is different from the equivalent circuit according to of the first embodiment in that the selection transistor 360 is not connected. Further, the drain of the amplification transistor 361 is connected to the selection transistor 330.

In the fourth embodiment of the present technology, as described above, since the FD sharing blocks 320 and 360 are symmetrical to each other without using the selection transistor 360 and the dummy transistor 332, the optical characteristics such as PRNU can be improved.

5. Fifth Embodiment

In the first embodiment described above, the two amplification transistors 331 and 361 are connected in parallel. Accordingly, the gate width W of the amplification transistors can be substantially twice as large as a case where parallel connection is not employed. However, an increase in the number of transistors in the Tr sharing block 310 makes it difficult to increase the light receiving areas of the photodiodes. The solid-state imaging element 200 according to the fifth embodiment is different from the solid-state imaging element 200 according to the first embodiment in that the number of amplification transistors is reduced.

Figure 18:
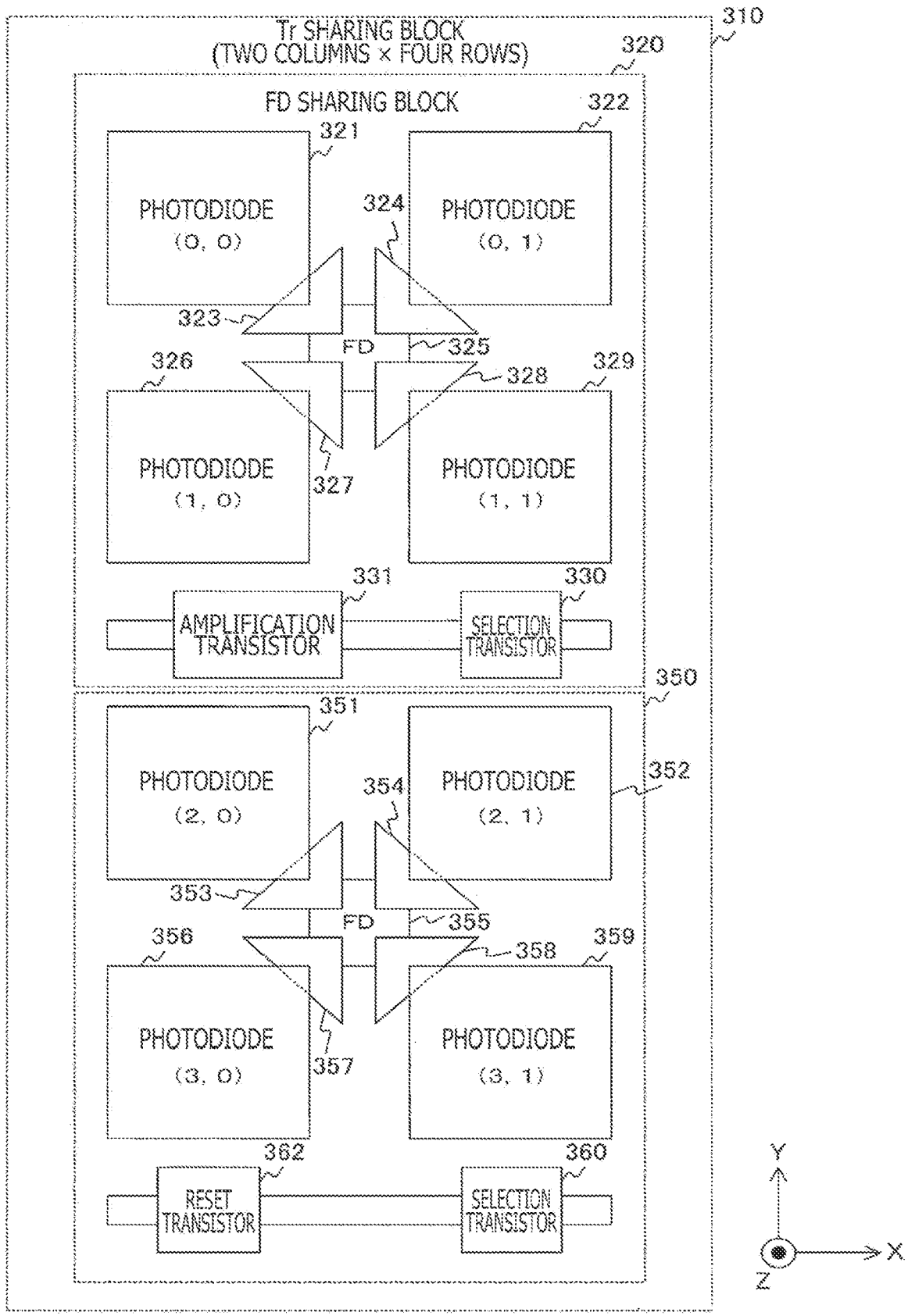
FIG. 18 is a plan view depicting an example of a layout of the elements in the Tr sharing block according to a fifth embodiment of the present technology.

FIG. 18 is a plan view depicting an example of a layout of the elements in the Tr sharing block 310 according to the fifth embodiment of the present technology. The Tr sharing block 310 according to the fifth embodiment is different from the Tr sharing block 310 according to the first embodiment in that the amplification transistor 361 and the dummy transistor 332 are not provided. Since the FD sharing blocks 320 and 350 with these transistors reduced are symmetrical to each other, the optical characteristics such as PRNU can be improved.

Further, in the fifth embodiment, the amplification transistor 331 is arranged between the photodiode 326 and the photodiode 351. The selection transistor 330 is arranged between the photodiode 329 and the photodiode 352. The reset transistor 362 is arranged between the photodiode 356 at the coordinates (3, 0) and the photodiode (not depicted) at the coordinates (4, 0) in the next row. The selection transistor 360 is arranged between the photodiode 359 at the coordinates (3, 1) and the photodiode (not depicted) at the coordinates (4, 1) in the next row.

It is to be noted that the selection transistor 330 is an example of the first transistor described in claims, while the selection transistor 360 is an example of the second transistor described in claims.

Figure 19:
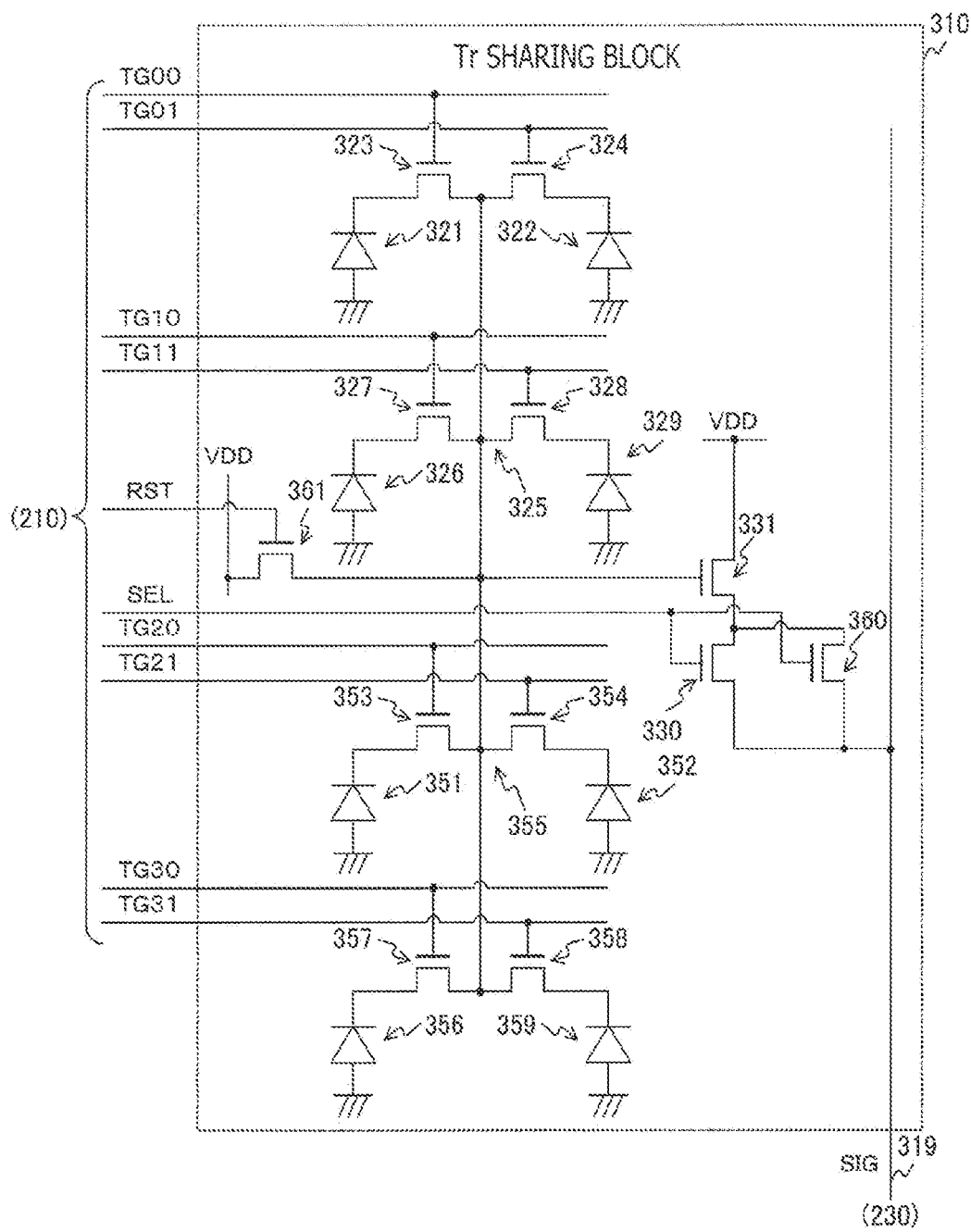
FIG. 19 is a circuit diagram depicting an example of an equivalent circuit of the Tr sharing block according to the fifth embodiment of the present technology.

FIG. 19 is a circuit diagram depicting an example of an equivalent circuit of the Tr sharing block 310 according to the fifth embodiment of the present technology. The equivalent circuit according to the fifth embodiment is different from the equivalent circuit according to the first embodiment in that the amplification transistor 361 is not connected. Further, the source of the selection transistor 360 is connected to the amplification transistor 331.

In the fifth embodiment of the present technology, as described above, since the FD sharing blocks 320 and 360 are symmetrical to each other without using the amplification transistor 361 and the dummy transistor 332, the optical characteristics such as PRNU can be improved.

6. Sixth Embodiment

In the first embodiment described above, the transistors such as the selection transistor 330 are arranged in the X direction in the Tr sharing block 310. With this arrangement, however, the pixel array section 300 in the Y direction is large in size, as compared with a case where these transistors are arranged in the Y direction. Further, the parallel connection of the selection transistors 330 and 360 increases the number of transistors in the Tr sharing block 310, which makes it difficult to increase the light receiving areas of the photodiodes. The solid-state imaging element 200 according to the sixth embodiment is different from the solid-state imaging element 200 according to the first embodiment in that the size in the Y direction and the number of selection transistors are reduced.

Figure 20:
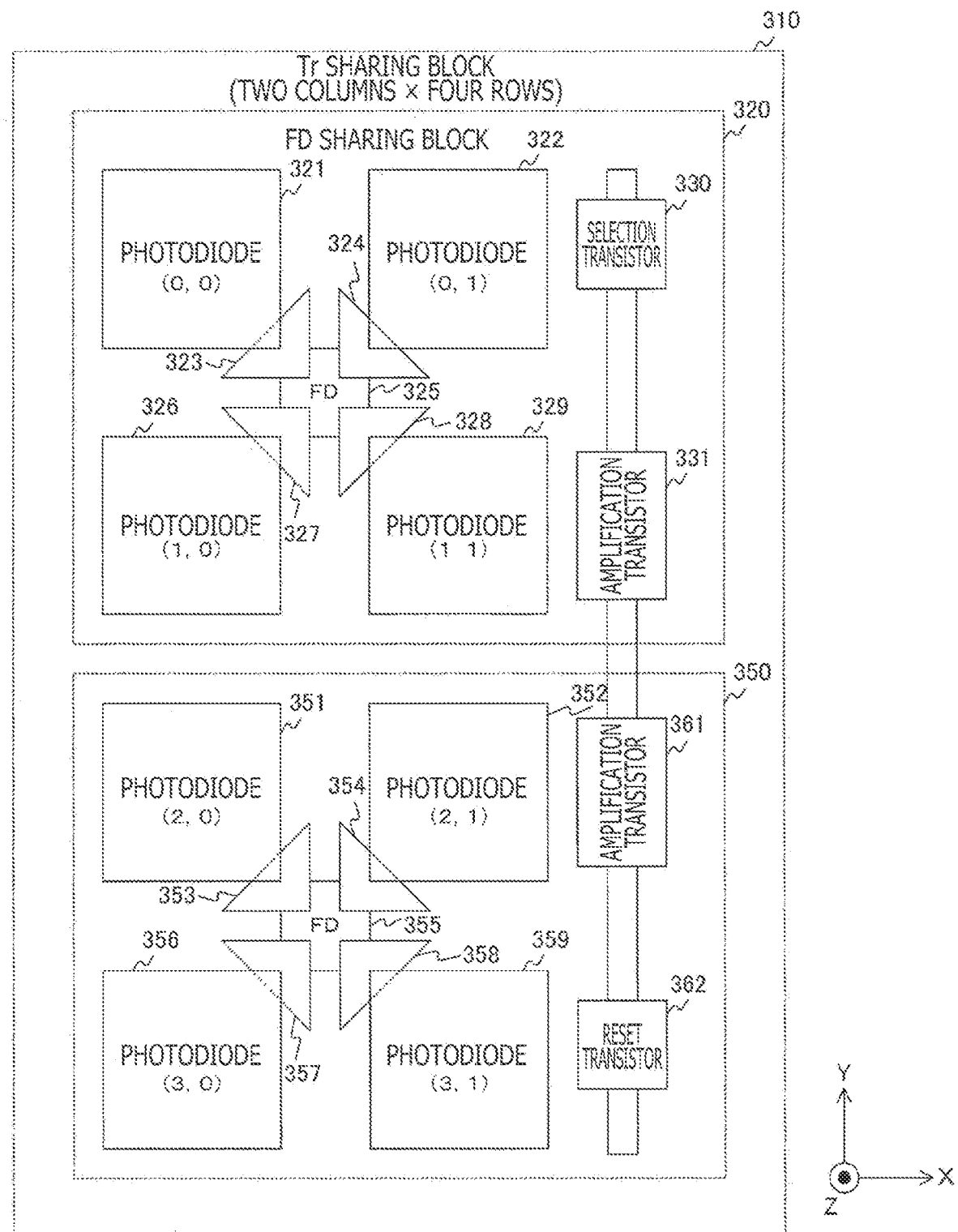
FIG. 20 is a plan view depicting an example of a layout of the elements in the Tr sharing block according to a sixth embodiment of the present technology.

FIG. 20 is a plan view depicting an example of a layout of the elements in the Tr sharing block 310 according to the sixth embodiment of the present technology. The Tr sharing block 310 according to the sixth embodiment is different from the Tr sharing block 310 according to the first embodiment in that the selection transistor 360 and the dummy transistor 332 are not provided. Since the FD sharing blocks 320 and 350 with these transistors reduced are symmetrical to each other, the optical characteristics such as PRNU can be improved.

Further, the selection transistor 330, the amplification transistor 331, the amplification transistor 361, and the reset transistor 362 are arranged in the Y direction. The selection transistor 330 is arranged at a position adjacent to the photodiode 322. The amplification transistor 331 is arranged at a position adjacent to the photodiode 329. The amplification transistor 361 is arranged at a position adjacent to the photodiode 352. The reset transistor 362 is arranged at a position adjacent to the photodiode 359. With the arrangement described above, the FD sharing block 320 and the FD sharing block 350 are line symmetrical to each other with respect to a boundary line between these blocks. It is to be noted that each of the selection transistor 330 and the reset transistor 362 is an example of another transistor described in claims.

An equivalent circuit of the Tr sharing block 310 according to the sixth embodiment is similar to the equivalent circuit according to the fourth embodiment depicted as an example in FIG. 17.

In the sixth embodiment of the present technology, as described above, since the selection transistor 330, the amplification transistor 331, the amplification transistor 361, and the reset transistor 362 are arranged in the Y direction, the size in the Y direction can be reduced, as compared with a case where the selection transistor 330, the amplification transistor 331, the amplification transistor 361, and the reset transistor 362 are arranged in the X direction. Further, since the FD sharing blocks 320 and 360 are symmetrical to each other without using the selection transistor 360 and the dummy transistor 332, the optical characteristics such as PRNU can be improved.

7. Seventh Embodiment

In the first embodiment described above, the transistors such as the selection transistor 330 are arranged in the X direction in the Tr sharing block 310. With this arrangement, however, the pixel array section 300 in the Y direction is large in size, as compared with a case where the transistors are arranged in the Y direction. Further, the parallel connection of the amplification transistors 331 and 361 increases the number of transistors in the Tr sharing block 310, which makes it difficult to increase the light receiving areas of the photodiodes. The solid-state imaging element 200 according to the seventh embodiment is different from the solid-state imaging element 200 according to the first embodiment in that the size in the Y direction and the number of amplification transistors are reduced.

Figure 21:
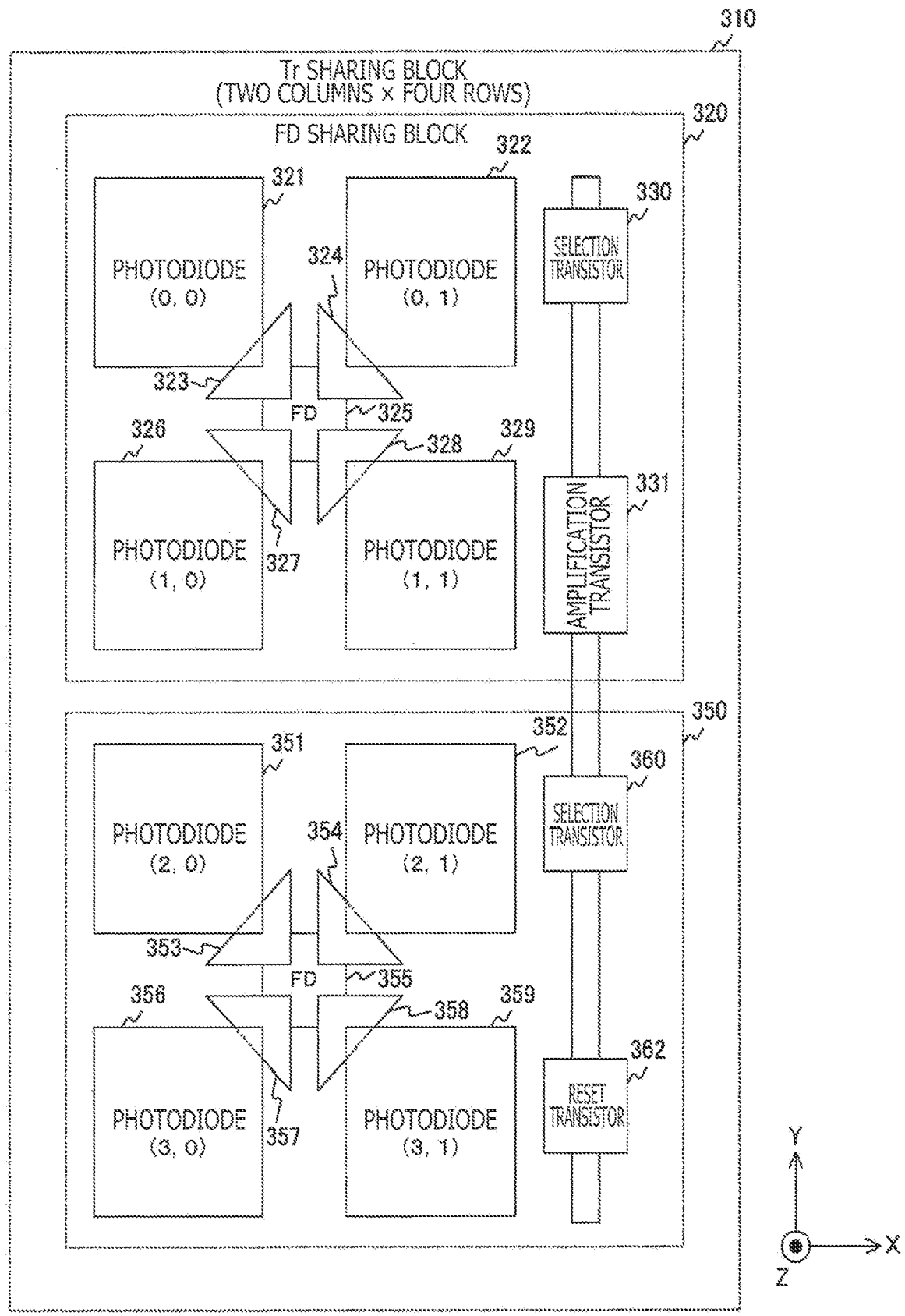
FIG. 21 is a plan view depicting an example of a layout of the elements in the Tr sharing block according to a seventh embodiment of the present technology.

FIG. 21 is a plan view depicting an example of a layout of the elements in the Tr sharing block 310 according to the seventh embodiment of the present technology. The Tr sharing block 310 according to the seventh embodiment is different from the Tr sharing block 310 according to the first embodiment in that the amplification transistor 361 and the dummy transistor 332 are not provided. Since the FD sharing blocks 320 and 350 with these transistors reduced are symmetrical to each other, the optical characteristics such as PRNU can be improved.

Further, the selection transistor 330, the amplification transistor 331, the selection transistor 360, and the reset transistor 362 are arranged in the Y direction. The selection transistor 330 is arranged at a position adjacent to the photodiode 322. The amplification transistor 331 is arranged at a position adjacent to the photodiode 329. The selection transistor 360 is arranged at a position adjacent to the photodiode 352. The reset transistor 362 is arranged at a position adjacent to the photodiode 359. It is to be noted that each of the amplification transistor 331 and the reset transistor 362 is an example of another transistor described in claims.

An equivalent circuit of the Tr sharing block 310 according to the seventh embodiment is similar to the equivalent circuit according to the fifth embodiment depicted as an example in FIG. 19. It is to be noted that in the first, second, and third embodiments, the transistor group may also be arranged in the Y direction as in the sixth and seventh embodiments.

In the seventh embodiment of the present technology, as described above, since the selection transistor 330, the amplification transistor 331, the selection transistor 360, and the reset transistor 362 are arranged in the Y direction, the size in the Y direction can be reduced, as compared with a case where the selection transistor 330, the amplification transistor 331, the selection transistor 360, and the reset transistor 362 are arranged in the X direction. Further, since the FD sharing blocks 320 and 360 are symmetrical to each other without using the amplification transistor 361 and the dummy transistor 332, the optical characteristics such as PRNU can be improved.

<8. Example of Application to Endoscopic Surgery System>

The technology (present technology) according to the present disclosure can be applied to various types of products. For example, the technology according to the present disclosure may be applied to an endoscopic surgery system.

Figure 22:
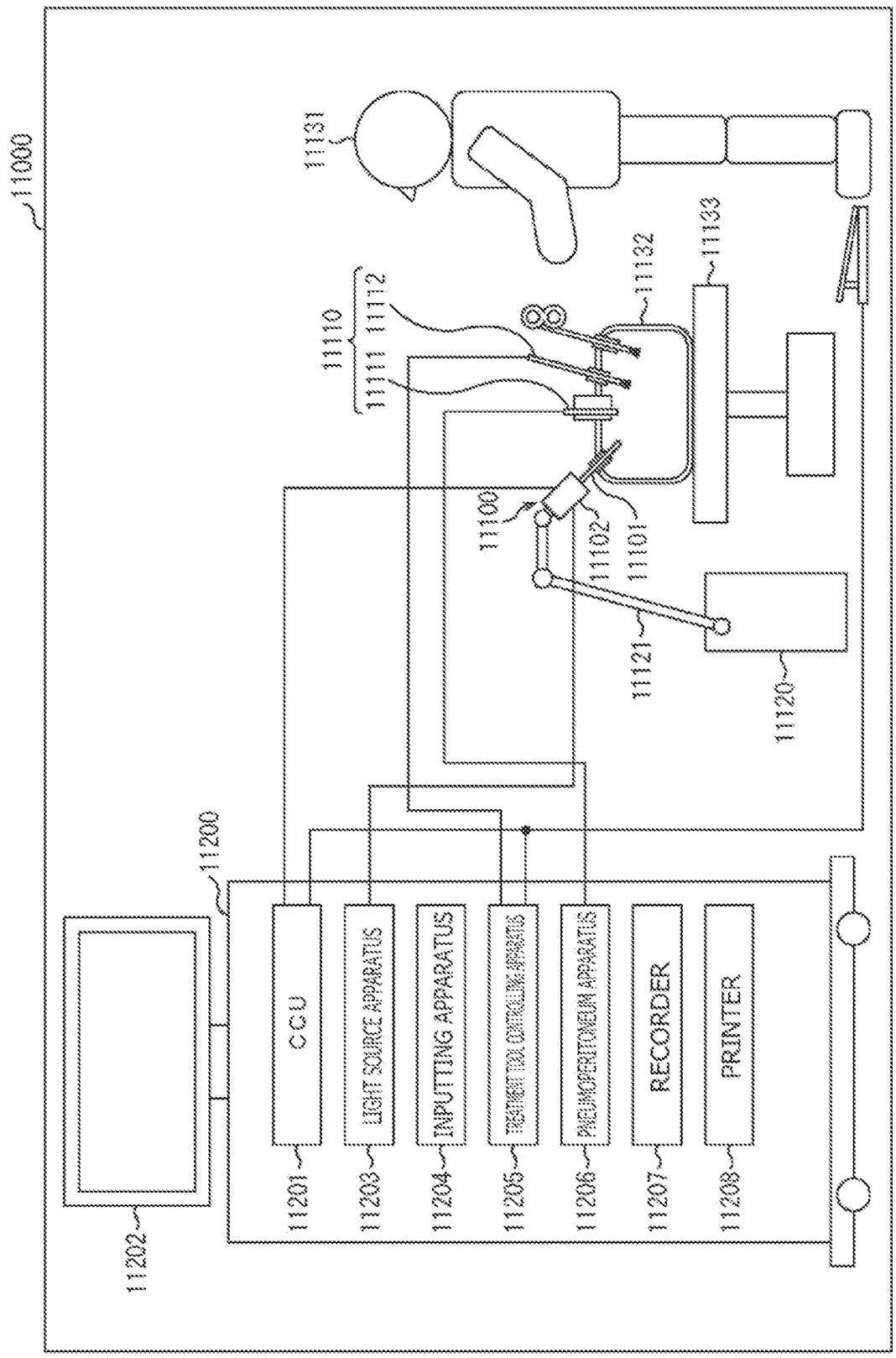
FIG. 22 is a view depicting an example of a schematic configuration of an endoscopic surgery system.

FIG. 22 is a view depicting an example of a schematic configuration of an endoscopic surgery system to which the technology according to an embodiment of the present disclosure (present technology) can be applied.

In FIG. 22, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 23:
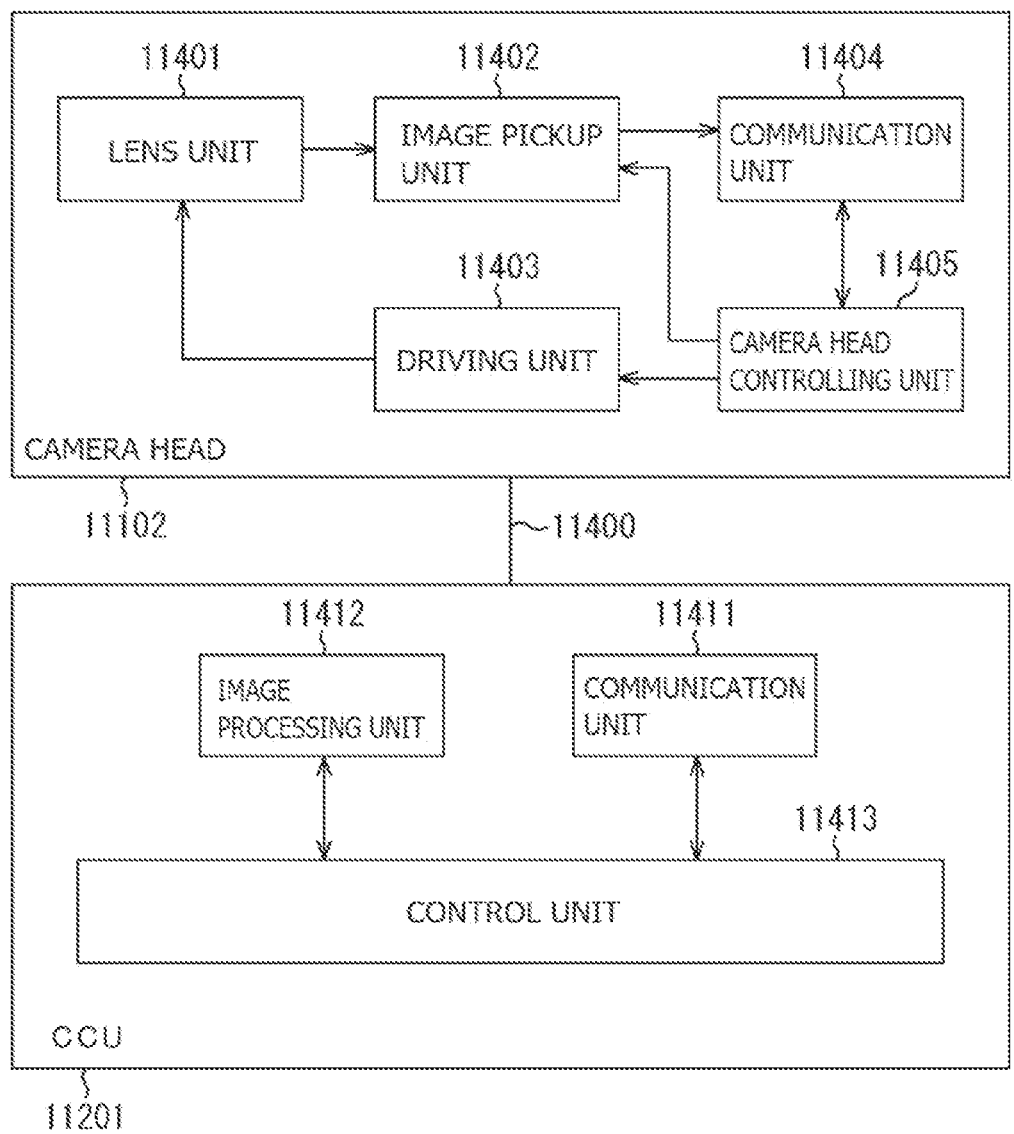
FIG. 23 is a block diagram depicting an example of a functional configuration of a camera head and a CCU.

FIG. 23 is a block diagram depicting an example of a functional configuration of the camera head 11102 and the CCU 11201 depicted in FIG. 22.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technology according to the present disclosure can be applied to the image pickup unit 11402 among the configurations described above. Specifically, the solid-state imaging element 200 in FIG. 2 can be applied to the image pickup unit 11402 in FIG. 23. Applying the technology according to the present disclosure to the image pickup unit 10402 can improve the driving force of the transistors and obtain a clearer image of a surgical region. Therefore, a surgeon can reliably check the surgical region.

It is to be noted that although the endoscopic surgery system has been described as an example here, the technology according to the present disclosure may be additionally applied to a microscopic surgery system or the like, for example.

<9. Example of Application to Mobile Body>

The technology (present technology) according to the present disclosure can be applied to various types of products. For example, the technology according to the present disclosure may be implemented as an apparatus to be mounted in any type of mobile body such as an automobile, an electric vehicle, a hybrid electric vehicle, a motorcycle, a bicycle, a personal mobility, an airplane, a drone, a ship, or a robot.

Figure 24:
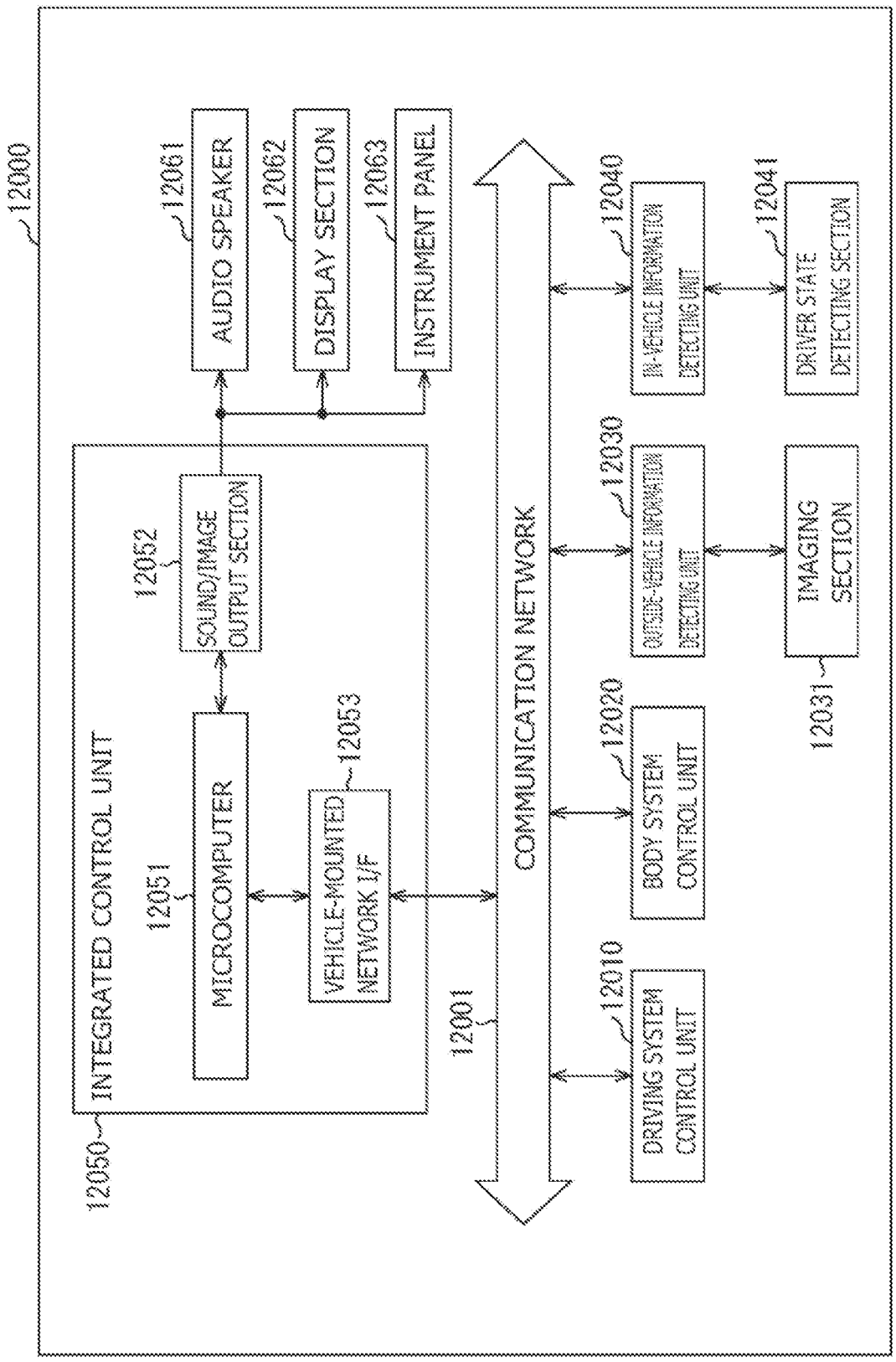
FIG. 24 is a block diagram depicting an example of schematic configuration of a vehicle control system.

FIG. 24 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 24, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 24, an audio speaker 12061, a display section 12062, and an instrument panel 12063 are illustrated as the output device. The display section 12062 may, for example, include at least one of an on-board display and a head-up display.

Figure 25:
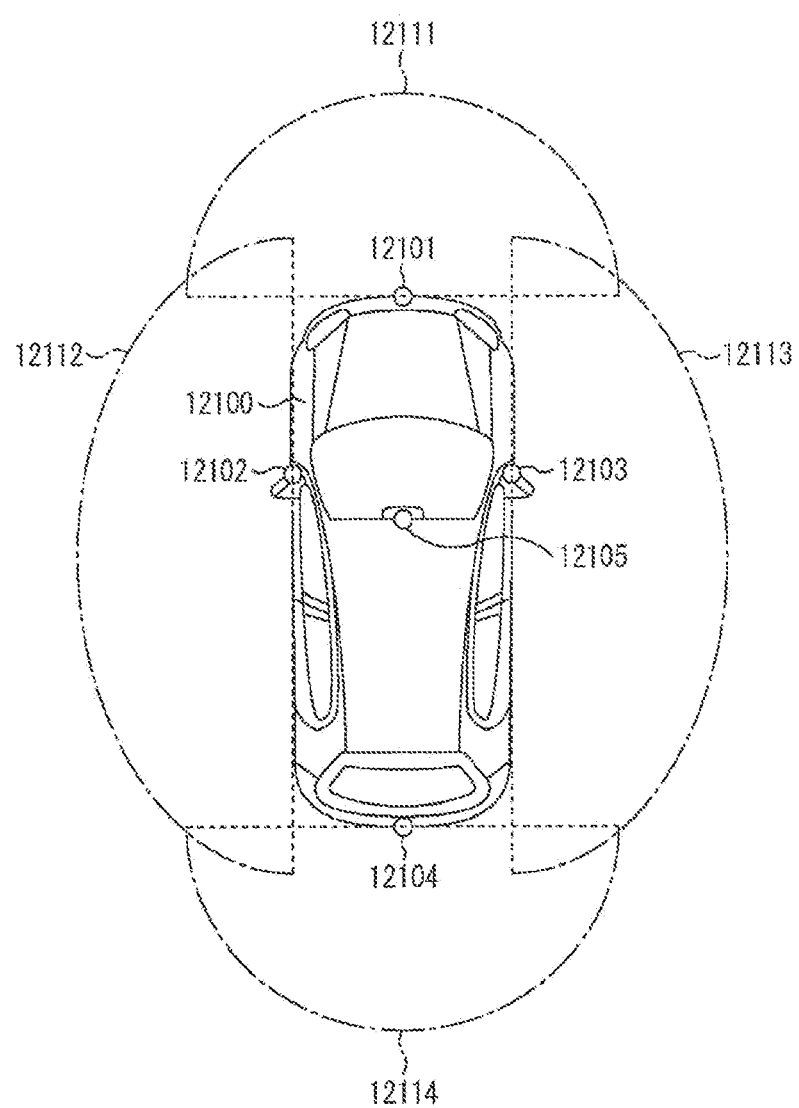
FIG. 25 is a diagram of assistance in explaining an example of installation positions of an outside-vehicle information detecting section and an imaging section.

FIG. 25 is a diagram depicting an example of the installation position of the imaging section 12031.

In FIG. 25, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained in the imaging sections 12101 and 12105 is used mainly to detect a preceding vehicle, a pedestrian, an obstacle, a signal, a traffic sign, a lane, or the like.

Incidentally, FIG. 25 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 among the configurations described above, for example. Specifically, the solid-state imaging element 200 in FIG. 2 can be applied to the imaging section 12031 in FIG. 24. Applying the technology according to the present disclosure to the imaging section 12031 can improve the driving force of the transistors and obtain a more easy-to-see photographed image. Therefore, driver fatigue can be reduced.

It is to be noted that the above-described embodiments describe examples for embodying the present technology, and there is a one-to-one correspondence relationship between the matters in the embodiments and the matters specifying the invention in claims. Similarly, there is a one-to-one correspondence relationship between the matters specifying the invention in claims and the matters, which are denoted with the same names as the matters specifying the invention in claims, in the embodiments of the present technology. However, the present technology is not limited to the embodiments and can be embodied by variously modifying the embodiments without departing from the scope of the present technology.

Further, the processing procedures described in the above-described embodiments may be regarded as a method including the series of procedures, or may be regarded as a program for causing a computer to carry out the series of procedures or as a recording medium storing the program. A CD (Compact Disc), an MD (MiniDisc), a DVD (Digital Versatile Disc), a memory card, a Blu-ray (registered trademark) Disc, or the like can be used as the recording medium, for example.

It is to be noted that the effects described in the present specification are merely examples and are not limitative. Further, additional effects may be provided.

It is to be noted that the present technology can also be configured as follows.

(1)

A solid-state imaging element including:

a first electric charge accumulating section and a second electric charge accumulating section arranged in a predetermined direction;

a plurality of first photoelectric conversion elements;

a first transfer section configured to transfer electric charge from the plurality of first photoelectric conversion elements to the first electric charge accumulating section and cause the first electric charge accumulating section to accumulate the electric charge;

a plurality of second photoelectric conversion elements;

a second transfer section configured to transfer electric charge from the plurality of second photoelectric conversion elements to the second electric charge accumulating section and cause the second electric charge accumulating section to accumulate the electric charge;

a first transistor configured to output a signal corresponding to an amount of the electric charge accumulated in each of the first electric charge accumulating section and the second electric charge accumulating section; and a second transistor arranged with the first transistor in the predetermined direction and connected in parallel to the first transistor.

(2)

The solid-state imaging element according to (1), in which each of the first electric charge accumulating section and the second electric charge accumulating section is configured to generate a voltage corresponding to the amount of the accumulated electric charge, and each of the first transistor and the second transistor includes an amplification transistor configured to amplify the voltage and output the voltage as the signal.

(3)

The solid-state imaging element according to (2), further including:

a selection transistor and a reset transistor arranged in the predetermined direction, in which the selection transistor is configured to, according to a predetermined selection signal, open and close a path between: the first transistor and the second transistor; and a predetermined signal line, and the reset transistor is configured to initialize the first electric charge accumulating section and the second electric charge accumulating section.

(4)

The solid-state imaging element according to (2), further including:

a third transistor and a fourth transistor arranged in the predetermined direction, in which the third transistor includes a selection transistor configured to open and close a path between the first transistor and a predetermined signal line according to a predetermined selection signal, and the fourth transistor includes a selection transistor configured to open and close a path between the third transistor and the predetermined signal line according to the predetermined selection signal.

(5)

The solid-state imaging element according to (4), further including:

a reset transistor and a dummy transistor arranged in the predetermined direction, in which the reset transistor is configured to initialize the first electric charge accumulating section and the second electric charge accumulating section.

(6)

The solid-state imaging element according to (4), further including:

a reset transistor and a fifth transistor arranged in the predetermined direction, in which the reset transistor is configured to initialize the first electric charge accumulating section and the second electric charge accumulating section.

(7)

The solid-state imaging element according to (6), in which the fifth transistor includes an amplification transistor connected in parallel to the first transistor and the second transistor.

(8)

The solid-state imaging element according to (6), in which the fifth transistor includes a selection transistor connected in parallel to one of the third transistor and the fourth transistor.

(9)

The solid-state imaging element according to (1), further including:

an amplification transistor and a reset transistor arranged in the predetermined direction, in which each of the first transistor and the second transistor includes a selection transistor configured to open and close a path between the third transistor and the predetermined signal line according to a predetermined selection signal, each of the first electric charge accumulating section and the second electric charge accumulating section is configured to generate a voltage corresponding to the amount of the accumulated electric charge, the amplification transistor is configured to amplify the voltage and output the voltage as the signal, and the reset transistor is configured to initialize the first electric charge accumulating section and the second electric charge accumulating section.

(10)

The solid-state imaging element according to any one of (1) to (9), further including:

another transistor different from the first transistor and the second transistor, in which the another transistor and one of the first transistor and the second transistor are arranged in a direction perpendicular to the predetermined direction.

(11)

The solid-state imaging element according to any one of (1) to (9), further including:

another transistor different from the first transistor and the second transistor, in which the first transistor, the second transistor, and the another transistor are arranged in the predetermined direction.

(12)

The solid-state imaging element according to any one of (1) to (10), further including:

a wiring layer, in which a signal line connected to the first transistor and the second transistor is wired along the predetermined direction.

(13)

An imaging apparatus including:

a first electric charge accumulating section and a second electric charge accumulating section arranged in a predetermined direction;

a plurality of first photoelectric conversion elements;

a first transfer section configured to transfer electric charge from the plurality of first photoelectric conversion elements to the first electric charge accumulating section and cause the first electric charge accumulating section to accumulate the electric charge;

a plurality of second photoelectric conversion elements;

a second transfer section configured to transfer electric charge from the plurality of second photoelectric conversion elements to the second electric charge accumulating section and cause the second electric charge accumulating section to accumulate the electric charge;

a first transistor configured to output a signal corresponding to an amount of the electric charge accumulated in each of the first electric charge accumulating section and the second electric charge accumulating section;

a second transistor arranged with the first transistor in the predetermined direction and connected in parallel to the first transistor; and a signal processing section configured to perform predetermined processing on the signal.

REFERENCE SIGNS LIST

100 Imaging apparatus
110 Optical section
120 DSP circuit
130 Display section
140 Operation section
150 Bus
160 Frame memory
170 Storage section
180 Power supply section
200 Solid-state imaging element
210 Vertical driving section
220 System control section
230 Column processing section
240 Horizontal driving section
300 Pixel array section
310 Tr sharing block
320, 350 FD sharing block
321, 322, 326, 329, 351, 352, 356, 359 Photodiode
323, 324, 327, 328, 353, 354, 357, 358 Transfer transistor
330, 334, 360 Selection transistor
331, 333, 361 Amplification transistor
332 Dummy transistor
362 Reset transistor
410 Photoelectric conversion layer
420 Transistor layer
430 First wiring layer
440 Second wiring layer
460 Third wiring layer
11402, 12031 Image pickup unit, imaging section

The invention claimed is:

1. An imaging device comprising:
a first section including eight photoelectric conversion elements, eight transfer transistors, a first floating diffusion, and a second floating diffusion;
a second section including eight photoelectric conversion elements, eight transfer transistors, a third floating diffusion, and a fourth floating diffusion, wherein the second section is adjacent to the first section in a plan view; and
a first amplification transistor, a second amplification transistor, a reset transistor and a selection transistor disposed between the first section and the second section,
wherein the first floating diffusion is coupled to the second floating diffusion,
the first floating diffusion is coupled to the first amplification transistor and the second amplification transistor,
the second floating diffusion is coupled to the first amplification transistor and the second amplification transistor, and
the first amplification transistor is disposed adjacent to the second amplification transistor in the plan view.

2. The imaging device according to claim 1,
wherein the first floating diffusion and the second floating diffusion are disposed along a first direction, and the third floating diffusion and the fourth floating diffusion are disposed along the first direction in the plan view.

3. The imaging device according to claim 2,
wherein the selection transistor, the first amplification transistor, second amplification transistor, and the reset transistor are disposed along the first direction in this order in the plan view.

4. The imaging device according to claim 2,
wherein the first floating diffusion and the second floating diffusions are disposed along the first direction in the plan view.

5. The imaging device according to claim 1,
wherein first to fourth floating diffusions are disposed in a semiconductor substrate.

6. The imaging device according to claim 1,
wherein the first amplification transistor and the second amplification transistor are coupled to a vertical signal line through the selection transistor.

7. The imaging device according to claim 1,
wherein the first amplification transistor is coupled to the second amplification transistor in parallel.

8. The imaging device according to claim 1,
wherein the first amplification transistor and the second amplification transistor are configured to output a signal corresponding to an amount of electric charge accumulated in the first floating diffusion and the second floating diffusion.

9. The imaging device according to claim 1,
wherein a shape of the first section and the second section are rectangles in the plan view.

* * * * *